(12) United States Patent
Motoyoshi

(10) Patent No.: US 12,327,818 B2
(45) Date of Patent: Jun. 10, 2025

(54) STACKED SEMICONDUCTOR DEVICE

(71) Applicant: TOHOKU-MICROTEC CO., LTD., Sendai (JP)

(72) Inventor: Makoto Motoyoshi, Sendai (JP)

(73) Assignee: TOHOKU-MICROTEC CO., LTD., Sendai (JP)

( * ) Notice: Subject to any disclaimer, the term of this patent is extended or adjusted under 35 U.S.C. 154(b) by 454 days.

(21) Appl. No.: 17/789,119

(22) PCT Filed: May 14, 2021

(86) PCT No.: PCT/JP2021/018303
§ 371 (c)(1),
(2) Date: Jun. 24, 2022

(87) PCT Pub. No.: WO2022/091465
PCT Pub. Date: May 5, 2022

(65) Prior Publication Data
US 2023/0343750 A1    Oct. 26, 2023

(30) Foreign Application Priority Data
Oct. 29, 2020   (JP) .................................. 2020-181091

(51) Int. Cl.
*H01L 25/065*   (2023.01)
*H01L 23/00*    (2006.01)

(52) U.S. Cl.
CPC .......... *H01L 25/0657* (2013.01); *H01L 24/16* (2013.01); *H01L 2224/16145* (2013.01);
(Continued)

(58) Field of Classification Search
None
See application file for complete search history.

(56) References Cited

U.S. PATENT DOCUMENTS 9,196,532 B2 * 11/2015 Tu ........................... H01L 24/05
2003/0214029 A1   11/2003 Tao et al.
(Continued)

FOREIGN PATENT DOCUMENTS

| JP | H5-1993-299525 A | 12/1993 |
|----|------------------|---------|
| JP | 2008533743 A     | 8/2008  |
| WO | 2013141091 A1    | 8/2015  |

OTHER PUBLICATIONS

English Translation for Japanese Application No. JP-1993-299525A, 21 pages.
(Continued)

*Primary Examiner* — Long Pham
(74) *Attorney, Agent, or Firm* — Polsinelli PC

(57) ABSTRACT

Stacked semiconductor device encompasses an upper semiconductor substrate, an upper insulating film laminated on a principal surface of the upper semiconductor substrate, an upper sealing-pattern orbiting along a periphery of the upper insulating film, a lower chip defining a chip mounting area in at least a part of a principal surface, the principal surface is facing to the upper insulating film, and a lower sealing-pattern disposed on the principal surface of the lower chip, delineating a pattern mating to a topology of the upper sealing-pattern, orbiting around the chip mounting area, configured to implement a metallurgical connector by solid-phase diffusion bonding to the upper sealing-pattern. Hermetical sealed space is established in an inside of the chip mounting area, the upper insulating film and the metallurgical connector.

4 Claims, 17 Drawing Sheets

(52) U.S. Cl.
CPC ............... *H01L 2225/06513* (2013.01); *H01L 2225/06524* (2013.01); *H01L 2225/06565* (2013.01)

(56) References Cited

U.S. PATENT DOCUMENTS

| | | | |
|---|---|---|---|
| 2006/0220197 A1* | 10/2006 | Kobrinsky | H01L 21/76888 |
| | | | 257/E21.705 |
| 2010/0308455 A1 | 12/2010 | Kim et al. | |
| 2015/0008593 A1 | 1/2015 | Takemoto et al. | |
| 2017/0012006 A1* | 1/2017 | Okumura | H01L 29/0649 |
| 2018/0226375 A1* | 8/2018 | Enquist | H01L 24/80 |

OTHER PUBLICATIONS

English Translation for Japanese Application No. JP-2008-533743A, 10 pages.

English Translation for Application No. JPWO 2013141091, 8 pages.

\* cited by examiner

F I G. 10
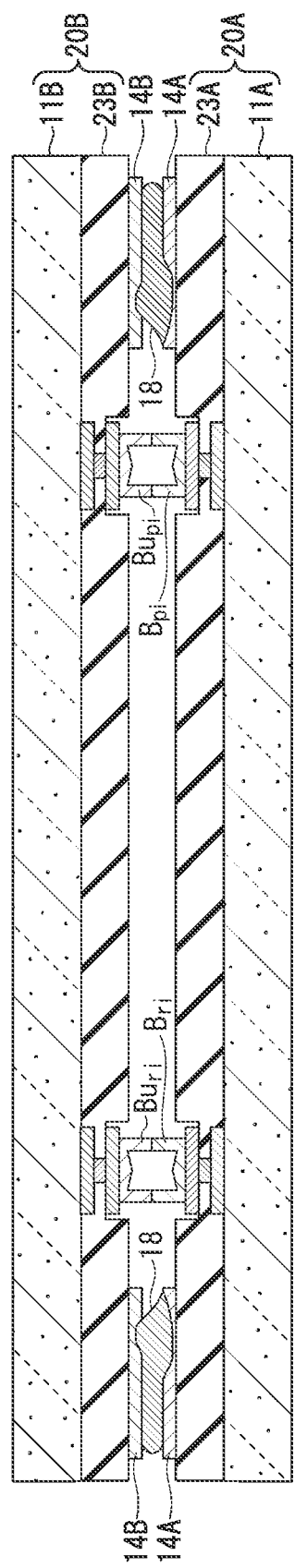

STACKED SEMICONDUCTOR DEVICE

CROSS-REFERENCE TO RELATED APPLICATIONS

This application is a national stage entry of PCT/JP2021/018303 filed May 14, 2021, said application is expressly incorporated herein in its entirety.

TECHNICAL FIELD

The present invention relates to a stacked semiconductor device in which a plurality of semiconductor chips is mutually stacked, and particularly relates to hermetically sealing techniques applicable to stacked semiconductor devices operating at high speed, and having miniaturized planar patterns.

BACKGROUND ART

Design rules of large-scale integrated circuits (LSIs) are more and more miniaturized, and there are trends toward three-dimensional stacked structures and others. As the miniaturization levels of the design rules for the integrated circuits are advanced, pitches between input electrodes and pitches between output electrodes connected to external circuits becomes finer and finer. In a generations of mobile communication systems on and after 5G (fifth generation mobile-communication system) technology, design rules for planar patterns of active elements will become ten nanometers or less due to the added requirements for the high-speed operations, and pitch intervals between input electrodes and between output electrodes will be ten micrometers or less in association with the shrinkages of the planar patterns of the active elements. As the pitch intervals between input electrodes and between output electrodes becomes narrow, it becomes difficult to employ solder-bump connected-electrodes that have been used in earlier technologies. In the solder-bump connected-electrodes, it is common to use tin-silver (SnAg) electroplating techniques in order to apply the solders. However, because the heights of the SnAg electroplating layers are varied, the protrusions of the solders when the solders are melted become problematic, in the structures using the solder-bump connected-electrodes, it is difficult to set the pitch intervals between input electrodes and between output electrodes to fifteen micrometers or less.

In the semiconductor packages in earlier technology generations in which the solder-bump connected-electrodes can be employed, the resin-sealing mold-structures, or the hermetically sealing structures, which use the liquid curable resins such as epoxy resins and others or the under-fills such as anisotropic conductive films (ACFs) or nonconductive films (NCFs) or others, are employed. However, in environments of high-speed operations required in technology generations on and after 5G technology, the trend of the device shrinkages will proceed to a miniaturized level such that the pitch intervals between input electrodes and between output electrodes are decreased to ten micrometers or less. Thereby, the employments of gold (Au) bumps, which will be explained in the Specification of the present invention, shall be required. As the miniaturization levels are advanced in which the pitch intervals between input electrodes and between output electrodes are decreased to ten micrometers or less, it becomes impossible to employ the conventionally-used resin-sealing mold-structure and the hermetic-seal architecture using the under-fill. In a case of the earlier solder bumps, there is a problem in which, when the solders are brought into contact with opposite electrodes, "solder wettability" causes the solders to be spread on electrode surfaces, and polymer such as NCF is pushed out from bonding interfaces. On the other hand, in the joint process through the Au bumps, which are preferable for the structure of miniaturized semiconductor integrated circuits in a next technology generation, Au bumps are bonded by solid-phase diffusion (solid-state diffusion). Then, if the small amount of the polymer such as NCF remains on the bonding interface of the Au bumps, the solid-phase diffusion is inhibited which disables metallurgical bonding. Even in a case of the stacked semiconductor device in which the pitch intervals between input electrodes and between output electrodes are ten micrometers or less, although a under-fill pattern of resin could be inserted between a lower chip and an upper chip, prior to the bonding process, there is a fear of occurrence of serious problem, such that gaps and babbles will enter in between the chips, and after the bonding process, in addition to a problem such that it is necessary to provide a margin in pattern alignment of the miniaturized Au bump. If the gaps are created and/or the babbles are included, the pressures in the gaps and the babbles will be changed through a temperature cycle test, and repetitive stress will be added to bump bonding portions. Moreover, if humidity enters into the gaps and the babbles, the humidity will be vaporized which leads to a risk of chip destruction. Therefore, in the environments of the high-speed operations required in the technology generations on and after 5G technology, the hermetic-seal architecture that does not use the under-fill is desired.

By the way, for technology generations using solder-bump connected-electrodes, which facilitate rough design rules with pitches of fifteen micrometers or more, a packaging technique with a hermetic-seal architecture implemented by bellows structure is proposed in Patent Literature (PTL) 1. In PTL 1, an anisotropic bellows-ring is used between a base substrate and a sealing cap for the bellows structure. The invention recited in PTL 1 is addressing to the unbalance of mechanical thermal stress, which is caused by a difference between an expansion associated with a temperature change of the solder-bump connected-electrodes inside the semiconductor chip and an expansion of metal in a sealing portion. That is, the technical objective of the invention recited in PTL 1 is directing to avoid the occurrence of crack in the solder-bump connected-electrodes caused by temperature cycles, due to the situation peculiar to the packaging techniques used in semiconductor devices in old technology generations in which the solder-bump connected-electrodes are used. In short, the invention recited in PTL 1 does not addressing to the peculiar specific problem of the stacked semiconductor devices in the miniaturized technology generation with the high-speed operation, in which the pitch intervals between input electrodes and between output electrodes are ten micrometers or less, thereby the use of the solder-bump connected-electrodes is prohibited. And furthermore, the invention recited in PTL 1 does not addressing to the technical objectives associated with the above peculiar specific problem.

CITATION LIST

Patent Literature

[PTL 1] JP H05-299525A

SUMMARY OF INVENTION

Technical Problem

The present invention is intended to solve the above problems, and an objective of the present invention is to provide a lower-price and a high-reliability stacked semiconductor device, which is easy in manufacturing a hermetic-seal architecture, without increasing the number of process steps, even in a miniaturized pitch interval, namely, the pitch intervals between input electrodes and between output electrodes are ten micrometers or less.

Solution to Problem

An aspect of the present invention inheres in a stacked semiconductor device encompassing (a) an upper semiconductor substrate in which an upper integrated circuit is merged, (b) an upper insulating film laminated on a principal surface of the upper semiconductor substrate, (c) an upper sealing-pattern implementing a closed planar pattern orbiting along a periphery of the upper insulating film, (d) a lower chip defining a chip mounting area in at least a part of a principal surface, the principal surface of the lower chip is facing to the upper insulating film, and (e) a lower sealing-pattern disposed on the principal surface of the lower chip, delineating a pattern mating to a topology of the upper sealing-pattern, orbiting around the chip mounting area, configured to implement a metallurgical connector, by solid-phase diffusion bonding of the upper sealing-pattern to the lower sealing-pattern. In the stacked semiconductor device pertaining to the aspect of the present invention, a hermetical sealed space is established in an inside of the chip mounting area, the upper insulating film and the metallurgical connector.

Advantageous Effects of Invention

According to the present invention, it is possible to provide the lower-price and high-reliability stacked semiconductor device, which is easy in manufacturing the hermetic-seal architecture, without increasing the number of process steps, even in the miniaturized pitch interval, namely, the pitch intervals between input electrodes and between output electrodes are ten micrometers or less.

BRIEF DESCRIPTION OF DRAWINGS

FIG. 10 is a cross-sectional view corresponding to FIG. 9, representing a structural condition after the hermetically-sealing step;

DESCRIPTION OF EMBODIMENTS

Figure 1:
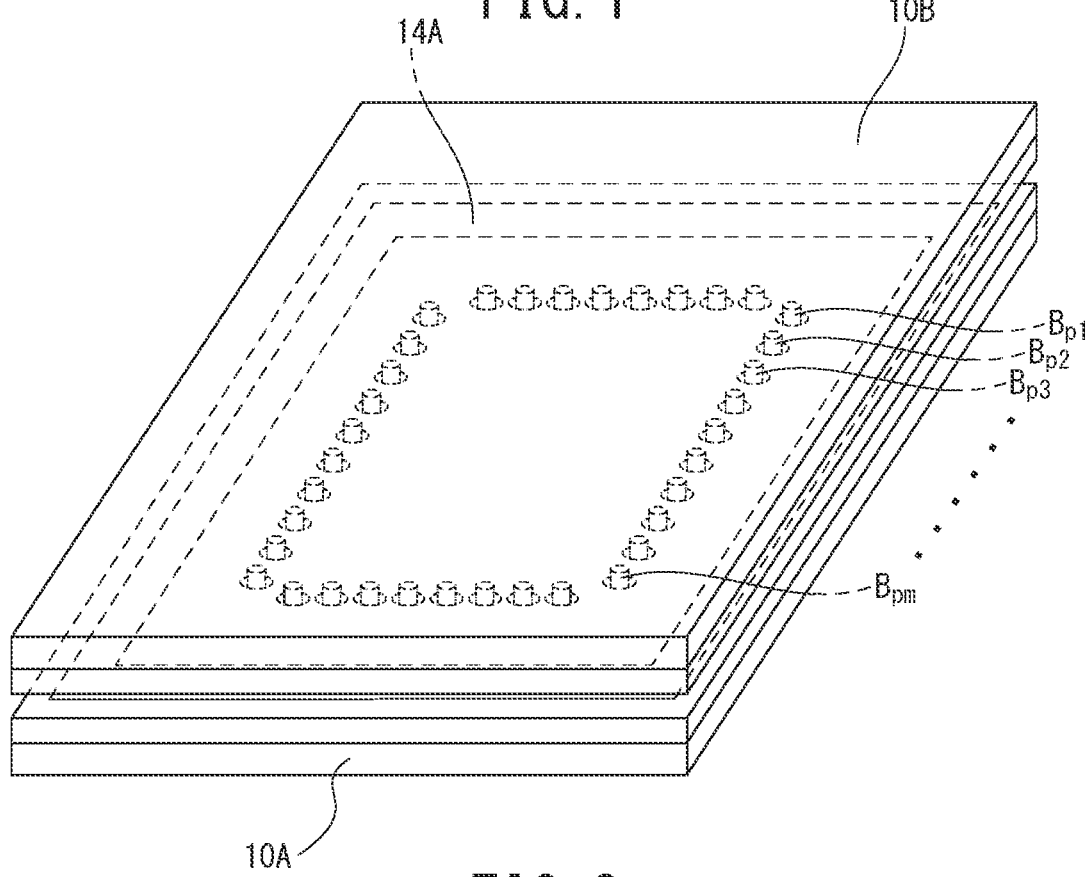
FIG. 1 is a perspective view (bird's-eye view) illustrating a stacked semiconductor device pertaining to a first embodiment of the present invention.

Hereinafter, first to fourth second embodiments of the present invention will be described with reference to the drawings. In the description of the drawings, the identical or similar parts are denoted by the identical or similar reference numerals, and redundant descriptions thereof will be omitted. However, the drawings are schematic, and the relation between the thickness and the plane dimensions, the ratio of the thickness of each layer, etc., may be different from the actual one. In addition, dimensional relations and ratios may also differ between the drawings. Further, the first to fourth embodiments illustrated below exemplify the apparatus and methods for embodying the technical idea of the present invention, and the technical idea of the present invention does not specify the material, shape, structure, arrangement, or the like of the components as follows.

Further, the definition of the orientation such as "upper", "lower", and the like, in the following description is merely a definition of the direction for convenience of explanation, and is not intended to limit the technical scope of the present invention. For example, the upper and lower are converted to right and left if observed by rotating the object by 90°, and the upper and lower are inverted if observed by rotating 180°, of course. Therefore, "the lower chip" and "the upper chip" are inverted respectively to read as "the upper chip" and "the lower chip", if observed by rotating 180°, of course.

First Embodiment

Figure 2:
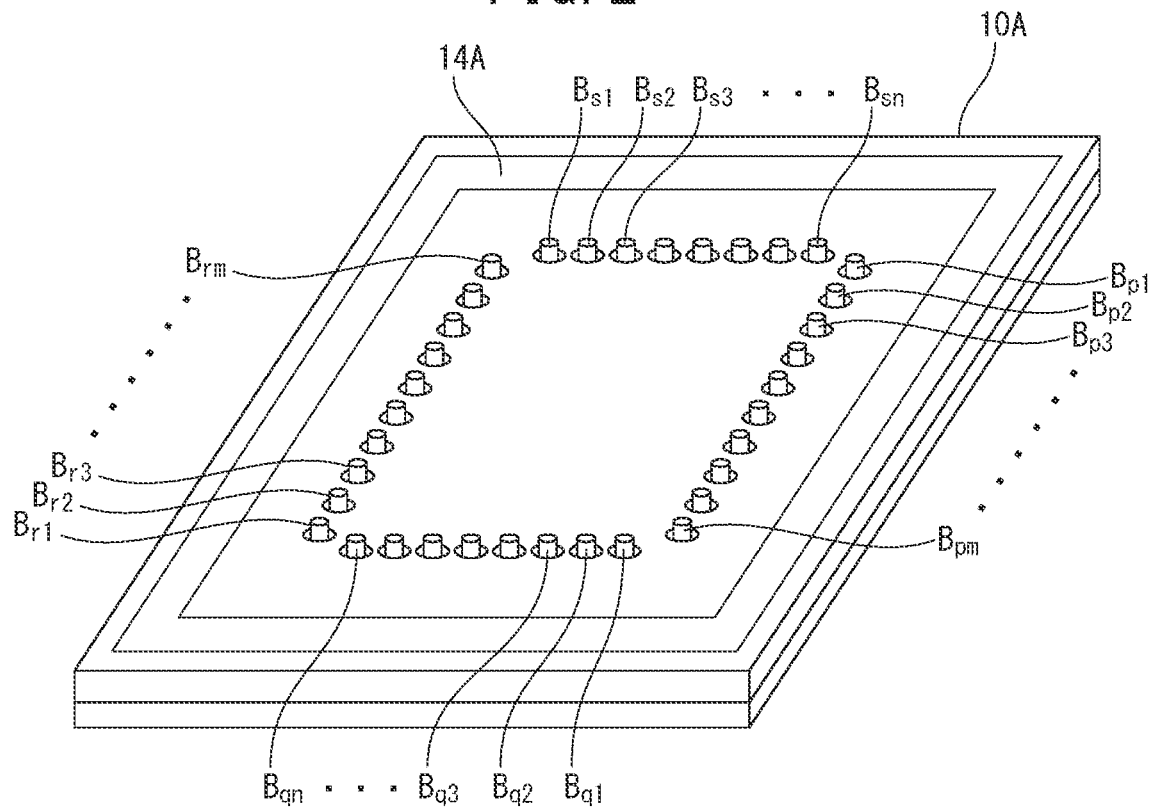
FIG. 2 is a bird's-eye view explaining a rough sketch of a lower chip used in the stacked semiconductor device pertaining to the first embodiment.
Figure 3:
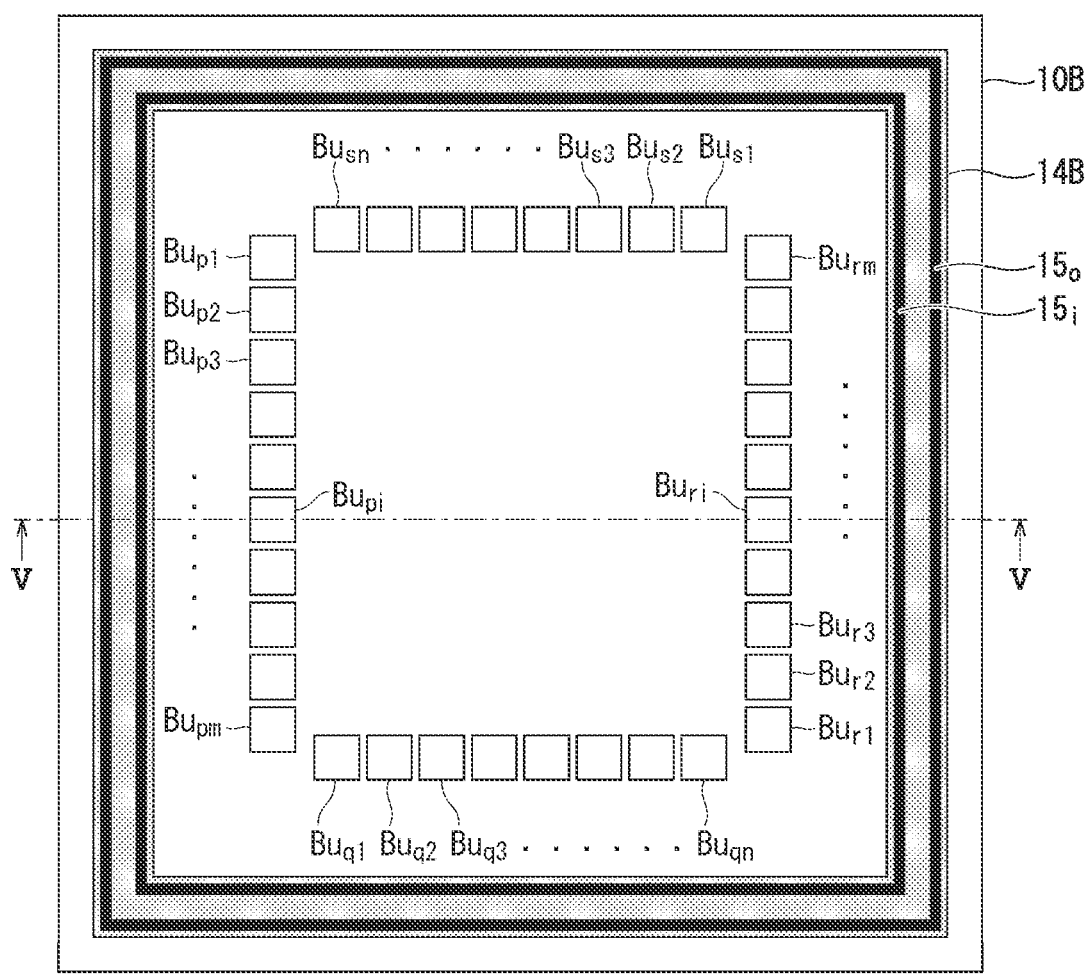
FIG. 3 is a plan view of an upper chip used in the stacked semiconductor device illustrated in FIG. 1.
Figure 5:
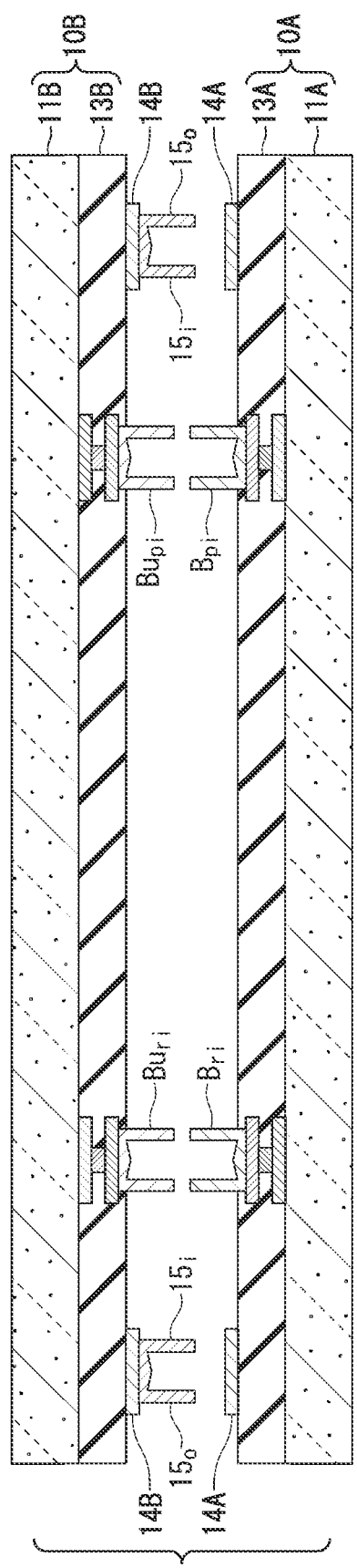
FIG. 5 is a cross-sectional view taken from a V-V direction in FIG. 3, representing a structural condition before hermetical sealing.
Figure 6:
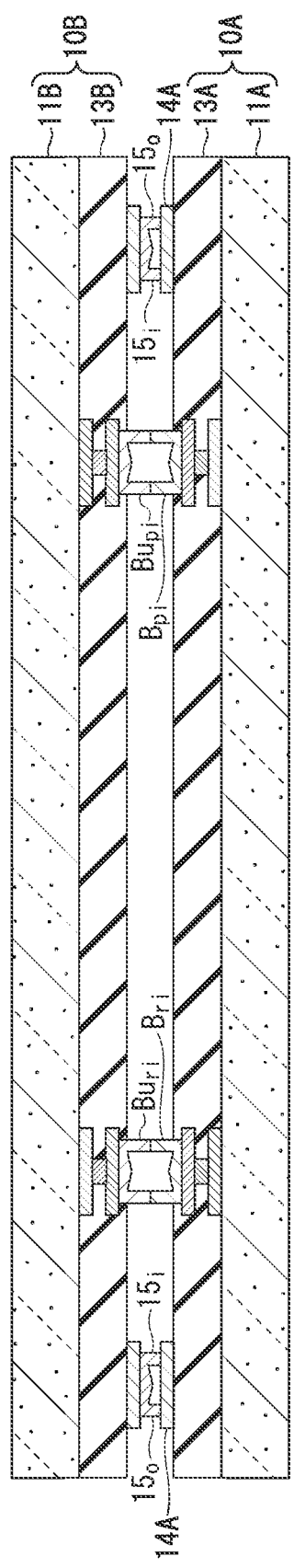
FIG. 6 is a cross-sectional view corresponding to FIG. 5, representing a structural condition after a hermetically-sealing step.

As illustrated in FIGS. 1 and 6, a stacked semiconductor device pertaining to a first embodiment of the present invention has a stacked structure, which encompasses a lower chip 10A and an upper chip 10B mounted on the lower chip 10A. As illustrated in FIGS. 2, 3 and 5, the lower chip 10A embraces a lower semiconductor substrate 11A, a lower integrated circuit merged at and in a surface area of a principal surface (a top surface) of the lower semiconductor substrate 11A, a lower insulating film 13A covering the lower integrated circuit at and in the principal surface (the top surface) of the lower semiconductor substrate 11A, and a strip-shaped lower sealing-pattern 14A orbiting along a periphery of the principal surface of the lower semiconductor substrate 11A on the lower insulating film 13A. The lower integrated circuit facilitates a high-speed operation with a finer and miniaturized pattern delineated by a design rule of, for example, three to seven nanometers. Similarly to many semiconductor chips, FIG. 3 exemplifies an architecture in which the lower chip 10A is rectangular, and therefore, the strip-shaped lower sealing-pattern 14A is a rectangular closed-loop pattern, implemented by a rectangular frame-shaped pattern (open structure of rectangular rim) along the periphery of the lower chip 10A. However, there is no necessity for the lower chip 10A to be rectangular closed-loop pattern, and in a case that the lower chip 10A is not rectangular, it goes without saying that the lower sealing-pattern 14A becomes a planar closed-loop pattern suitable for the shape of the lower chip 10A.

Figure 4:
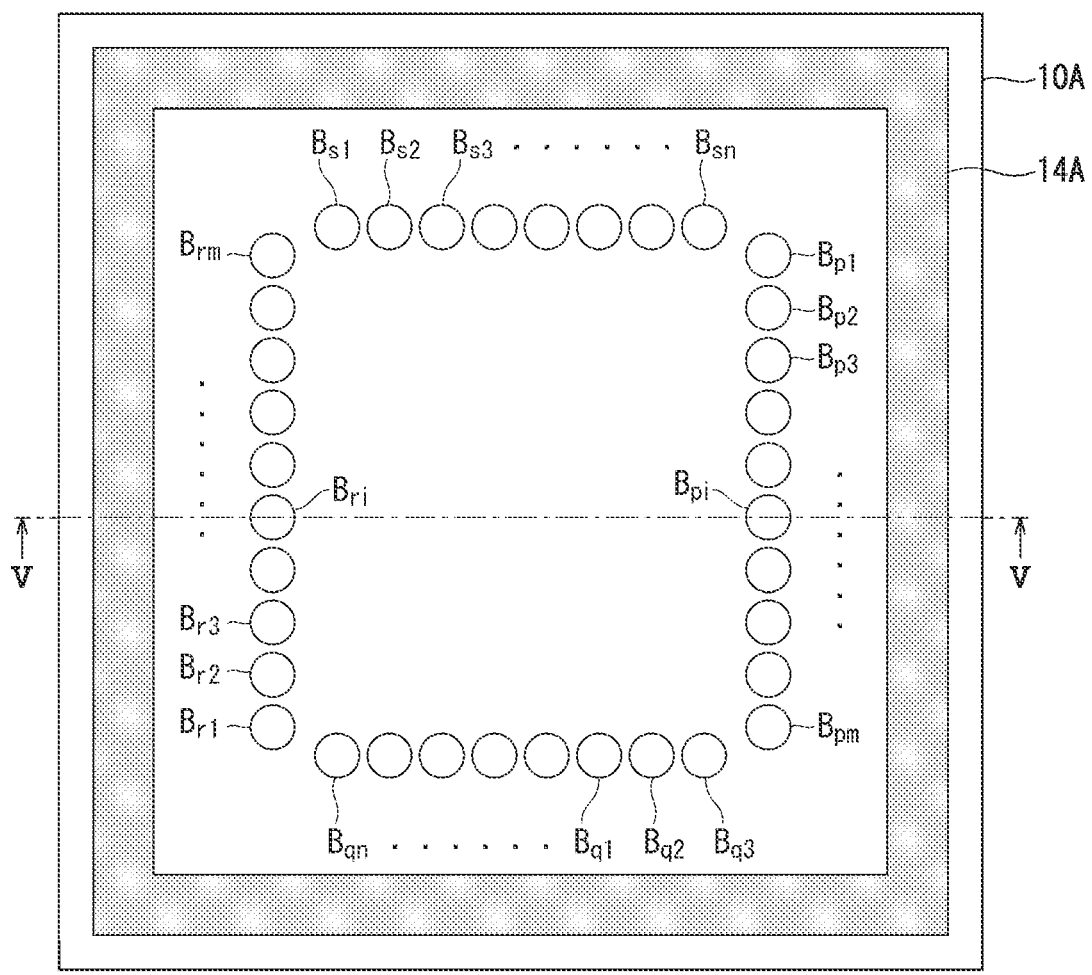
FIG. 4 is a plan view of the lower chip used in the stacked semiconductor device illustrated in FIG. 1.

On the other hand, as illustrated in FIGS. 3 and 5, the upper chip 10B of the stacked semiconductor device pertaining to the first embodiment encompasses an upper semiconductor substrate 11B, an upper integrated circuit merged at and in a surface area of a principal surface of the upper semiconductor substrate 11B, an upper insulating film 13B laminated on the principal surface of the upper semiconductor substrate 11B so as to cover the upper integrated circuit, a strip-shaped second sealing-land 14B orbiting along the periphery of the principal surface of the upper semiconductor substrate 11B on the upper insulating film 13B, and an outer sealing-wall $15_o$ and an inner sealing-wall $15_i$, which extend parallel to each other, while being spaced apart from each other and adjacent to each other, along the periphery of the upper semiconductor substrate 11B on the second sealing-land 14B. Similarly to the lower integrated circuit of the lower chip 10A, the upper integrated circuit has a fine and miniaturized planar pattern, which is delineated by design rule of three to seven nanometers and facilitates a high-speed operation. The second sealing-land 14B, the outer sealing-wall $15_o$ and the inner sealing-wall $15_i$ implement "an upper sealing-pattern (14B, $15_o$ and $15_i$)" of the upper chip 10B. As can be understood from FIG. 6, since the lower sealing-pattern 14A and the upper sealing-pattern (14B, $15_o$ and $15_i$) are bonded by the solid-phase diffusion, a metallurgical connector (14A, $15_o$ and $15_i$) is constructed. A hermetical sealed space is established in the inside of the lower insulating film 13A, the upper insulating film 13B and the metallurgical connector (14A, $15_o$ and $15_i$). As illustrated in FIGS. 2 and 4, hollow-cylindrical lower-bumps $B_{p1}$, $B_{p2}$, $B_{p3}$, - - - , $B_{pm}$ are arrayed at a pitch of ten micrometers or less, in an area inside of the orbiting pattern of the lower sealing-pattern 14A in the lower chip 10A. When a side of a rectangular frame-shaped pattern implemented by the lower sealing-pattern 14A, which is oriented in the direction of the array of the lower-bumps $B_{p1}$, $B_{p2}$, $B_{p3}$, - - - , $B_{pm}$, is defined as "the first side", hollow-cylindrical lower-bumps $B_{q1}$, $B_{q2}$, $B_{q3}$, - - - , $B_{qn}$ are aligned at a pitch of ten micrometers or less, around the central area of the lower chip 10A, along a second side of a rectangular frame-shaped pattern that is continuous with the first side and orthogonal to the first side. Hollow-cylindrical lower-bumps $B_{r1}$, $B_{r2}$, $B_{r3}$, - - - , $B_{rm}$ are aligned at a pitch of ten micrometers or less, around the central area of the lower chip 10A, along a third side of a rectangular frame-shaped pattern that is continuous with the second side and orthogonal to the second side. Hollow-cylindrical lower-bumps $B_{s1}$, $B_{s2}$, $B_{s3}$, - - - , $B_{sn}$ are aligned at a pitch of ten micrometers or less, around the central area of the lower chip 10A, along a fourth side of a rectangular frame-shaped pattern that is continuous with the third side and orthogonal to the third side.

Therefore, the array of the lower-bumps $B_{p1}$, $B_{p2}$, $B_{p3}$, - - - , $B_{pm}$, the array of the lower-bumps $B_{q1}$, $B_{q2}$, $B_{q3}$, - - - , $B_{qn}$, the array of the lower-bumps $B_{r1}$, $B_{r2}$, $B_{r3}$, - - - , $B_{rm}$, and the array of the lower-bumps $B_{s1}$, $B_{s2}$, $B_{s3}$, - - - , $B_{sn}$ create another rectangular frame-shaped pattern in the inside of the rectangular frame-shaped pattern implemented by the lower sealing-pattern 14A. The arrays of the lower-bumps $B_{p1}$, $B_{p2}$, $B_{p3}$, - - - , $B_{pm}$; $B_{q1}$, $B_{q2}$, $B_{q3}$, - - - , $B_{qn}$; $B_{r1}$, $B_{r2}$, $B_{r3}$, - - - , $B_{rm}$; and $B_{s1}$, $B_{s2}$, $B_{s3}$, - - - , $B_{sn}$ are allocated so as to mate to the topology of the arrangement of bonding pads, which serve as input and output electrodes (hereinafter referred as "input/output electrodes") of the lower integrated circuit. By the way, in the following explanations, there may be a context in which the lower-bumps $B_{p1}$, $B_{p2}$, $B_{p3}$, - - - , $B_{pm}$; $B_{q1}$, $B_{q2}$, $B_{q3}$, - - - , $B_{qn}$; $B_{r1}$, $B_{r2}$, $B_{r3}$, - - - , $B_{rm}$; and $B_{s1}$, $B_{s2}$, $B_{s3}$, - - - , $B_{sn}$ are abbreviated as "the lower-bumps $B_{ij}$ (i=p, q, r and s: j=positive integers of 1 to n or 1 to m)" in generic expression. By the way, the exemplified lower-bump $B_{ij}$ is not limited to the hollow-cylindrical shape, and the array of the lower-bumps $B_{ij}$ is not limited to the case in which the bumps are arranged in orbiting manner in a topology of single rectangle. The array of the lower-bumps $B_{ij}$ may be planar patterns of concentric rectangles or concentric circles, which orbit in double, triple or more multiples on the lower chip 10A. Or alternatively, the array of the lower-bumps $B_{ij}$ may be arranged in a planar pattern of a matrix deployed on the lower chip 10A.

As the material of the lower semiconductor substrate 11A, for example, it is possible to adopt silicon substrate. However, adoption of the silicon substrate is merely an exemplification for the convenience of explanation. The material of the lower semiconductor substrate 11A may be compound semiconductors such as silicon carbide (SiC), gallium arsenide (GaAs) or the like. It is possible to merge various integrated circuits on the surface of the lower semiconductor substrate 11A as the lower integrated circuits. For example, such as memories of dynamic random-access memory (DRAM), static random-access memory (SRAM) and others, or pixel arrays of a solid-state imaging device can be merged in the lower semiconductor substrate 11A as the lower integrated circuits. Or alternatively, the lower integrated circuits may have circuit blocks or pixel arrays for arithmetic operational circuits, control circuits, input/output circuits, sensing circuits, amplifiers and other. However, these circuits are mere exemplifications. As the lower insulating film 13A, for example, it is possible to adopt inorganic insulating films such as silicon oxide film ($SiO_2$ film), silicon nitride film ($Si_3N_4$ film), brosilicate glass film (BSG film), fluorinated silicon oxide film (SiOF film), carbon-containing silicon oxide film (SiOC film) and others. Furthermore, organic insulating films such as hydrogenated silicon oxycabide (SiCOH), hydrogen silsesquioxane (HSQ), porous methyl silsesquioxane film, poly arylene film and others can be employed. And it is also possible to construct multi-level interconnection-insulators of various multi-level schemes, by combining and laminating the above mentioned various insulating films. The lower insulating film 13A may be a single layer implemented only by a single field insulating film, or may be implemented by multi-level structures, combining the above mentioned various insulating films. In a case of the multi-level structure, the top layer can serve as a passivation film.

The top surface of the lower insulating film 13A is desired to be planarized at a high precision by polishing method such as chemical mechanical polishing (CMP). The lower sealing-pattern 14A is prepared to have a sufficient strength and have a necessary size, so that corruption such as crack and the like is not generated in the lower insulating film 13A. For the hollow-cylindrical lower-bump $B_{ij}$ and the lower sealing-pattern 14A, for example, it is possible to adopt soft metallic materials whose Vickers hardness is about 20 Hv to 30 Hv, such as gold (Au) and the like. Moreover, the soft metallic materials may be Au-alloys such as Au-silicon (Si), Au-germanium, (Ge), Au-antimony (Sb), Au-tin (Sn), Au-lead (Pb), Au-zinc (Zn), Au-copper (Cu) and others. Each of the Au-alloys may include Au of 80% or more, and each of the Au-alloys has Vickers hardness of about 15 Hv to 120 Hv. Vickers hardness of Au-90 Sn alloy, which includes 90% Sn, is about 16 Hv, and therefore, Au-90 Sn alloy indicates remarkably the lower hardness property of Sn. The lower sealing-pattern 14A may be implemented by a multi-level structure encompassing an underlying layer of the Au-alloy, whose Vickers hardness is relatively small and an upper layer laminated on the underlying layer, the upper layer may include refractory metals, such as nickel (Ni), chrome (Cr), titanium (Ti), tantalum (Ta), manganese (Mn), ruthenium (Ru), tungsten (W) and others.

Although illustration is omitted, the lower bump-lands serving as the lower layer of the hollow-cylindrical lower-bumps $B_{ij}$ may include the refractory metals such as Ni, Cr, Ti and others so that the lower bump-lands may be brought into contact with bottoms of the lower-bumps $B_{ij}$. The lower bump-lands may be buried in the lower insulating film 13A constructing the multi-level interconnection-insulator, and the lower bump-lands and the lower-bumps $B_{ij}$ can be connected to each other through via-plugs. The lower bump-lands are electrically connected through via-plugs and others to bonding pads serving as the input/output electrodes of the lower integrated circuit.

As illustrated in FIG. 5, bottoms of the outer sealing-wall $15_o$ and the inner sealing-wall $15_i$ which extend parallel to each other are connected to each other. Thus, when a direction in which the outer sealing-wall $15_o$ and the inner sealing-wall $15_i$ extend parallel to each other is defined as a longitudinal direction, a cross-section vertical to the longitudinal direction of the upper sealing-pattern (14B, $15_o$ and $15_i$) exhibits a U-shaped topology. As mentioned already, the stacked semiconductor device pertaining to the first embodiment is explained as an example of architectures in which the lower sealing-pattern 14A deployed on the lower chip 10A is assumed to be the rectangular frame-shaped pattern. Therefore, as illustrated in FIG. 3, layout of the second sealing-land 14B arranged on the upper chip 10B corresponds to the pattern of the lower sealing-pattern 14A, and the second sealing-land 14B implements a rectangular closed-loop geometry, in a rectangular frame-shaped pattern almost approximately to a mirror image relationship with the lower sealing-pattern 14A. However, when the lower sealing-pattern 14A is not rectangular frame-shaped, it goes without saying that the second sealing-land 14B also implements the closed-loop planar pattern, to which the shape of the lower sealing-pattern 14A is projected.

As illustrated in FIG. 3, in the inside area of the orbiting pattern of the second sealing-land 14B on the upper chip 10B, hollow square-cylindrical upper-bumps $B_{up1}$, $B_{up2}$, $B_{up3}$, - - - -, $B_{upm}$ are aligned at a pitch of ten micrometers or less, correspondingly to the array of the lower-bumps $B_{p1}$, $B_{p2}$, $B_{p3}$, - - - , $B_{pm}$. When a side of a rectangular frame-shaped pattern of the second sealing-land 14B along the direction of the array of the upper-bumps $B_{up1}$, $B_{up2}$, $B_{up3}$, - - - - , $B_{upm}$ is defined as "the first side of the upper rectangle", hollow square-cylindrical upper-bumps $B_{uq1}$, $B_{uq2}$, $B_{uq3}$, - - - , $B_{uqn}$ are aligned at a pitch of ten micrometers or less, correspondingly to the array of the lower-bumps $B_{q1}$, $B_{q2}$, $B_{q3}$, - - - - , $B_{qn}$, around the central area of the upper chip 10B, along a second side of the upper rectangle that is continuous with the first side of the upper rectangle and orthogonal to the first side of the upper rectangle. Hollow square-cylindrical upper-bumps $B_{ur1}$, $B_{ur2}$, $B_{ur3}$, - - - - , $B_{urn}$ are aligned at a pitch of ten micrometers or less, correspondingly to the array of the lower-bumps $B_{r1}$, $B_{r2}$, $B_{r3}$, - - - , $B_{rm}$, around the central area of the upper chip 10B, along the third side of the upper rectangle that is continuous with the second side of the upper rectangle and orthogonal to the second side of the upper rectangle.

Hollow square-cylindrical upper-bumps $B_{us1}$, $B_{us2}$, $B_{us3}$, - - - - , $B_{usn}$ are aligned at a pitch of ten micrometers or less, correspondingly to the array of the lower-bumps $B_{s1}$, $B_{s2}$, $B_{s3}$, - - - , $B_{sn}$, around the central area of the upper chip 10B, along a fourth side of the upper rectangle that is continuous with the third side of the upper rectangle and orthogonal to the third side of the upper rectangle. The arrays of the upper-bumps $B_{up1}$, $B_{up2}$, $B_{up3}$, - - - , $B_{upm}$; $B_{uq1}$, $B_{uq2}$, $B_{uq3}$, - - - , $B_{uqn}$; $B_{ur1}$, $B_{ur2}$, $B_{ur3}$, - - - , $B_{urm}$; $B_{us1}$, $B_{us2}$, $B_{us3}$, - - - , $B_{usn}$ correspond to the arrays of patterns of bonding pads serving as input/output electrodes of the upper integrated circuit. By the way, in the following explanations, there may be a context in which the upper-bumps $B_{up1}$, $B_{up22}$, $B_{up3}$, - - - , $B_{upm}$; $B_{uq1}$, $B_{uq2}$, $B_{uq3}$, - - - , $B_{qn}$; $B_{ur1}$, $B_{ur2}$, $B_{ur3}$, - - - , $B_{urm}$; $B_{us1}$, $B_{us2}$, $B_{us3}$, - - - , $B_{usn}$ are abbreviated as "the upper-bumps $B_{uij}$ (i=p, q, r and s: j=a positive integer of 1 to n or 1 to m)" in generic expression. By the way, the exemplified upper-bumps $B_{uij}$ are not limited to the hollow square cylindrical shape. Also, the array of the upper-bumps $B_{uij}$ are not limited to the topogy in which the bumps are arranged in orbiting manner in the rectangle as illustrated in FIG. 3. For example, if the array of the lower-bumps $B_{ij}$ has the array topology such as a matrix or the like, the upper-bumps $B_{uij}$ are also arrayed in the matrix topology on the upper chip 10B, correspondingly to the array of the lower-bumps $B_{ij}$.

As a material for the upper semiconductor substrate 11B, the silicon substrate can be elected similarly to the lower semiconductor substrate 11A. However, elections of the silicon substrates are merely exemplifications. The elections of the materials for the upper semiconductor substrate 11B are not limited to the silicon substrates. As the upper integrated circuit merged in the upper semiconductor substrate 11B, various circuits or various circuit blocks can be integrated at and in the surface of the upper semiconductor substrate 11B. For example, as the various circuits or various circuit blocks, such as memories, arithmetic operational circuits, control circuit, input/output circuits, sensing circuits, amplifiers and others can be included. For the upper insulating film 13B, for example, it is possible to adopt the inorganic insulating films such as $SiO_2$, $Si_3N_4$, BSG, SiOF, SiOC films and others. Furthermore, the organic insulating films may include SiCOH, HSQ, porous methyl silsesquioxane, poly arylene films and others. And, the upper insulating film 13B may be a multi-level interconnection-insulator of various multi-level schemes, by combining and laminating the above mentioned various insulating films. The upper insulating film 13B may be a single layer implemented by a single field insulating film, or may be a multi-level structure, in which the above mentioned various insulating films are combined. In the case of the multi-level structure, the top layer can serve as the passivation film. The top surface of the upper insulating film 13B is desired to be planarized at a high precision by polishing method such as CMP.

As illustrated in FIG. 3, the outer sealing-wall $15_o$ and the inner sealing-wall $15_i$ are orbiting patterns, respectively, implemented by double lines in a planar pattern. Each of the outer sealing-wall $15_o$ and the inner sealing-wall $15_i$ delineates a rectangular closed-loop, and orbits along the periphery of the upper semiconductor substrate 11B. The planar pattern of each of the outer sealing-wall $15_o$ and the inner sealing-wall $15_i$ is preferred to be a closed-loop topology in a shape of rectangular ring. However, a topology is not excluded in which a part of the ring pattern is cut to an extent that the interruption does not affect the hermetical sealing performance. A parallel-and-vertical wall-structure ($15_o$, $15_i$) for sealing that orbit in the shape of the rectangular ring, in the periphery of the upper chip 10B of the stacked semiconductor device pertaining to the first embodiment, while keeping the topology of the parallel walls, can be constructed, for example, by a method similar to the manufacturing method of the square cylinder of the cylindrical bumps proposed by the present inventor in JP 2019-190775A. The cylindrical lower-bumps $B_{ij}$ provided on the lower chip 10A can be also constructed by the method disclosed in JP 2019-190775A. That is, the parallel-and-vertical wall-structure ($15_o$, $15_i$) for sealing provided in the periphery of the upper chip 10B can be established by the method disclosed in JP 2019-190775A, simultaneously with the upper-bumps $B_{uij}$ allocated around the central area.

2) In addition, the parallel-and-vertical wall-structure ($15_o$, $15_i$) for sealing provided in the periphery of the upper chip 10B can be easily built by various sidewall techniques employed as the fabrication methods of the semiconductor integrated circuits. For example, the parallel-and-vertical wall-structure ($15_o$, $15_i$) for sealing can be fabricated by a method using a strip-shaped photo-resist pattern, which has a rectangular cross-section perpendicular to the longer direction of the strip-shaped photo-resist pattern. Namely, in the fabrication method of the parallel-and-vertical wall-structure ($15_o$, $15_i$), the strip-shaped photo-resist pattern orbiting around the upper chip 10B, is provided firstly as a base pattern. And, thereafter, the pair of the vertical sidewalls of the base pattern is covered by a metallic film made of Au, Au-alloy and the like, which is deposited on the entire surface of the base pattern by vacuum evaporation or sputtering. After that, the metallic film deposited on the top surface of the photo-resist pattern as the base pattern is selectively removed by etch-back and the like, and further, when the photo resist film as the base pattern is removed, the parallel-and-vertical wall-structure ($15_o$, $15_i$) for sealing can be established, in which two vertical sidewalls are opposite to each other in parallel. The parallel vertical walls that can be made by the well-known sidewall process shall be referred as "the sidewall pattern" in the explanation of the stacked semiconductor device pertaining to the first embodiment.

For materials of the hollow square-cylindrical upper-bump $B_{uij}$, metallic material having property such that, by the pressure of the thermal-compression-bonding under normal pressure or reduced pressure or the ultrasonic thermal-compression-bonding, the surface of the metallic material of the hollow square-cylindrical upper-bump $B_{uij}$ can be easily bonded to the hollow-cylindrical lower-bump $B_{ij}$ by the solid-phase diffusion, is preferred. Similarly, for each of the outer sealing-wall $15_o$ and the inner sealing-wall $15_i$, metallic material is preferred, which can be easily bonded to the lower sealing-pattern 14A by the solid-phase diffusion by the thermal-compression-bonding or the ultrasonic thermal-compression-bonding. The outer sealing-wall $15_o$ and the inner sealing-wall $15_i$ may be made of the same material as the upper-bump $B_{uij}$. For example, Au or Au-alloy such as Au—Si, Au—Ge, Au—Sb, Au—Sn, Au—Pb, Au—Zn, Au—Cu et al. can be elected for the material of the outer sealing-wall $15_o$ and inner sealing-wall $15_i$, which implement U-shaped cross section, and the upper-bumps $B_{uij}$, under a condition that the lower-bump $B_{ij}$ and the lower sealing-pattern 14A are made of Au or Au-alloy.

When the thermal-compression-bonding process is executed on the outer sealing-wall $15_o$ and the inner sealing-wall $15_i$ to the lower sealing-pattern 14A, the outer sealing-wall $15_o$ and the inner sealing-wall $15_i$ are deformed themselves. And, the outer sealing-wall $15_o$ and the inner sealing-wall $15_i$ are bonded to the lower sealing-pattern 14A by the solid-phase diffusion. And therefore, the outer sealing-wall $15_o$ and the inner sealing-wall $15_i$ are metallurgically jointed to the lower sealing-pattern so as to construct the metallurgical connector (14A, $15_o$ and $15_i$), thereby achieving the hermetical sealing. Since each of the outer sealing-wall $15_o$ and the inner sealing-wall $15_i$ is prepared as the sidewall pattern defined by the vertical sidewalls whose thicknesses are about 70 to 700 nanometers, it is possible to take merit of the technical feature that the outer sealing-wall $15_o$ and the inner sealing-wall $15_i$ are easily deformed by the force at a time of compression-bonding. The outer sealing-wall $15_o$ and the inner sealing-wall $15_i$ can be provided by the same process, by using the same material as the upper-bump $B_{uij}$. Thus, the outer sealing-wall $15_o$ and the inner sealing-wall $15_i$ can be manufactured at lower cost, without increasing the extra process steps. Since the outer sealing-wall $15_o$ and the inner sealing-wall $15_i$ can be deformed easily, the hermetical sealing that is high in fabrication yield and high in reliability can be achieved at lower cost and easily, without increasing the number of the process steps. Preferably, when each of the outer sealing-wall $15_o$ and the inner sealing-wall $15_i$ is provided as a straight sidewall whose thickness is about 100 to 300 nanometers, the characteristics that the outer sealing-wall $15_o$ and the inner sealing-wall $15_i$ are easily deformed by the force at the time of the compression-bonding becomes more remarkable. After the hermetical sealing, the outer sealing-wall $15_o$ and the inner sealing-wall $15_i$ are deformed, which leads to a result that the appearance of the vertical sidewalls as illustrated in FIG. 5 is lost. Hence, the metallurgical connector (14A, $15_o$ and $15_i$) exhibits an amorphous shape that includes irregular curved surfaces which are mutually folded, as illustrated in FIG. 6.

As illustrated in FIG. 5, the second sealing-land 14B is a member serving as a base strip for the outer sealing-wall $15_o$ and inner sealing-wall $15_i$, which implement a U-shaped cross-section. The second sealing-land 14B is preferable to have a sufficient strength and a necessary size so that the pressures applied to the outer sealing-wall $15_o$ and the inner sealing-wall $15_i$ can be absorbed and dispersed, so that damage such as crack and the like is not generated in the upper insulating film 13B, when the lower chip 10A and the upper chip 10B are hermetically sealed. Therefore, the second sealing-land 14B can have the multi-level structure, which encompasses an upper layer of Au or Au-alloy and an underlying layer made of refractory metal, for example, Ti, Ni, Cr, Ta, Mn, Ru, W and the like. Although illustration is omitted, by incorporating a lower layer of the refractory metal, such as Ni, Cr, Ti and the like, in the upper bump-land, which serves as the underlying layer of the upper-bump $B_{uij}$ (the upper layer in an orientation represented by FIG. 5), the upper bump-land will be brought into contact with the bottom of the upper-bump $B_{uij}$. The upper bump-lands may be buried in the upper insulating film 13B implementing the multi-level interconnection-insulator, and the upper bump-lands and the upper-bumps $B_{uij}$ can be connected through via-plugs to each other. The upper bump-lands are electrically connected through via-plugs and others to the bonding pads serving as the input/output electrodes of the upper integrated circuit.

As mentioned above, the pattern of the strip-shaped lower sealing-pattern 14A, which goes around the periphery of the lower chip 10A, implements the rectangular closed-loop pattern. And, the upper sealing-pattern (14B, $15_o$, $15_i$) goes around the periphery of the upper chip 10B, such that at least a part of the upper sealing-pattern (14B, $15_o$, and $15_i$) exhibits the mirror image relationship at the size and shape, configured to mate the topology of the lower sealing-pattern 14A. Thus, according to the stacked semiconductor device pertaining to the first embodiment, it is possible to hermetically seal easily the lower chip 10A with the upper chip 10B at lower cost, without increasing the number of the process steps, by constructing the metallurgical connector (14A, $15_o$ and $15_i$) as illustrated in FIG. 6, through the metallurgical bonding of the lower sealing-pattern 14A with the upper sealing-pattern (14B, $15_o$ and $15_i$), even in the case that the semiconductor integrated circuit having the miniaturized planar pattern, in which the pitch intervals between input electrodes and between output electrodes are ten micrometers or less, is integrated.

Second Embodiment

As illustrated in FIG. 10, a stacked semiconductor device pertaining to a second embodiment of the present invention is similar to the stacked semiconductor device of the first embodiment, in that a lower chip 20A and an upper chip 20B mounted on the lower chip 20A implement a stacked structure. However, as illustrated in FIGS. 9 and 10, the lower chip 20A encompasses a lower semiconductor substrate 11A, a lower integrated circuit merged at and in the surface area of the principal surface of the lower semiconductor substrate 11A, a lower insulating film 23A covering the lower integrated circuit at and in the principal surface (at and in the top surface) of the lower semiconductor substrate 11A, a strip-shaped first sealing-land 14A that goes around the periphery of the principal surface of the lower semiconductor substrate 11A on the lower insulating film 23A, and an outer sealing-wall $17_o$ and an inner sealing-wall $17_i$, each of which snakes parallel to each other, while being spaced apart from each other and adjacent to each other, along the periphery of the lower semiconductor substrate 11A, on the first sealing-land 14A. That is, the configuration of the stacked semiconductor device pertaining to the second embodiment differs from the configuration of the stacked semiconductor device of the first embodiment, in that the first sealing-land 14A, the outer sealing-wall $17_o$ and the inner sealing-wall $17_i$ implement "a lower sealing-pattern (14A, $17_o$ and $17_i$)" of the lower chip 20A. The lower integrated circuit is similar to the stacked semiconductor device of the first embodiment, in that the lower integrated circuit pertaining to the second embodiment exhibits a finer and miniaturized pattern delineated by design rule of, for example, three to even nanometers. Similarly to many semiconductor chips, FIG. 8 exemplifies the case in which the lower chip 20A is rectangular. Therefore, the strip-shaped first sealing-land 14A is a rectangular closed-loop pattern implemented by a rectangular frame-shaped pattern (open structure of rectangular rim), circling along the periphery of the lower chip 20A. However, there is no necessity for the lower chip 20A to be rectangular, and in a case that the lower chip 20A is not rectangular, it goes without saying that the first sealing-land 14A becomes a planar closed-loop pattern suitable for the shape of the lower chip 20A.

Figure 7:
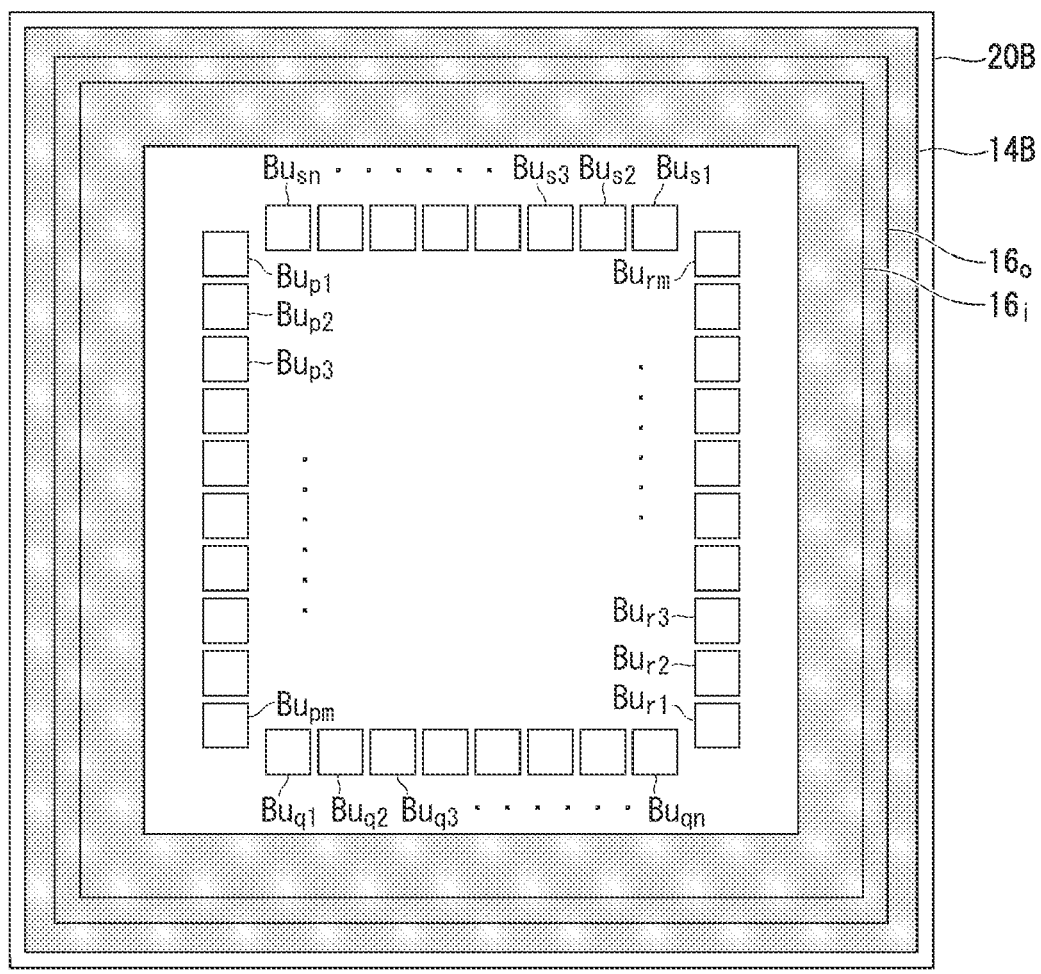
FIG. 7 is a plan view of an upper chip used in a stacked semiconductor device pertaining to a second embodiment of the present invention.

On the other hand, as illustrated in FIGS. 7 and 9, the upper chip 20B of the stacked semiconductor device pertaining to the second embodiment encompasses an upper semiconductor substrate 11B, an upper integrated circuit merged at and in a surface area of a principal surface of the upper semiconductor substrate 11B, an upper insulating film 23B formed on the principal surface of the upper semiconductor substrate 11B so as to cover the upper integrated circuit, a strip-shaped second sealing-land 14B orbiting along the periphery of the principal surface of the upper semiconductor substrate 11B on the upper insulating film 23B, and an outer sealing-wall $16_o$ and an inner sealing-wall $16_i$, which snake parallel to each other, while being spaced apart from each other and adjacent to each other, along the periphery of the upper semiconductor substrate 11B on the second sealing-land 14B. Similarly to the lower integrated circuit of the lower chip 20A, the upper integrated circuit has a fine and miniaturized planar pattern, which facilitate a high-speed operation, delineated by design rule of, for example, three to seven nanometers. The second sealing-land 14B, the outer sealing-wall $16_o$ and the inner sealing-wall $16_i$ implement "an upper sealing-pattern (14B, $16_o$ and $16_i$)" of the upper chip 20B. As can be understood from FIG. 10, since the lower sealing-pattern (14A, $17_o$ and $17_i$) and the upper sealing-pattern (14B, $16_o$ and $16_i$) are bonded by the solid-phase diffusion, a metallurgical connector (14A, 14B and 18) is constructed. A hermetical sealed space is established in the inside of the lower insulating film 23A, the upper insulating film 23B and the metallurgical connector (14A, 14B and 18).

Figure 8:
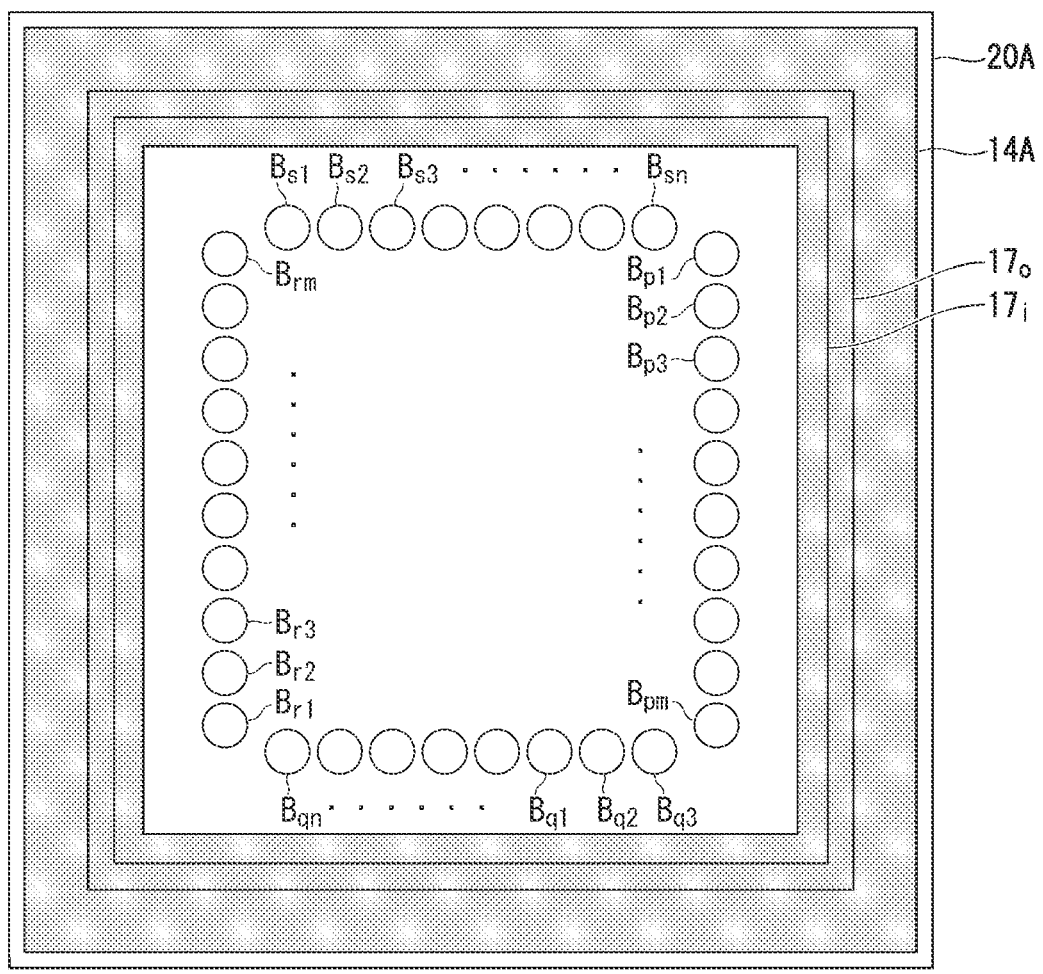
FIG. 8 is a plan view of a lower chip used in the stacked semiconductor device pertaining to the second embodiment.
Figure 9:
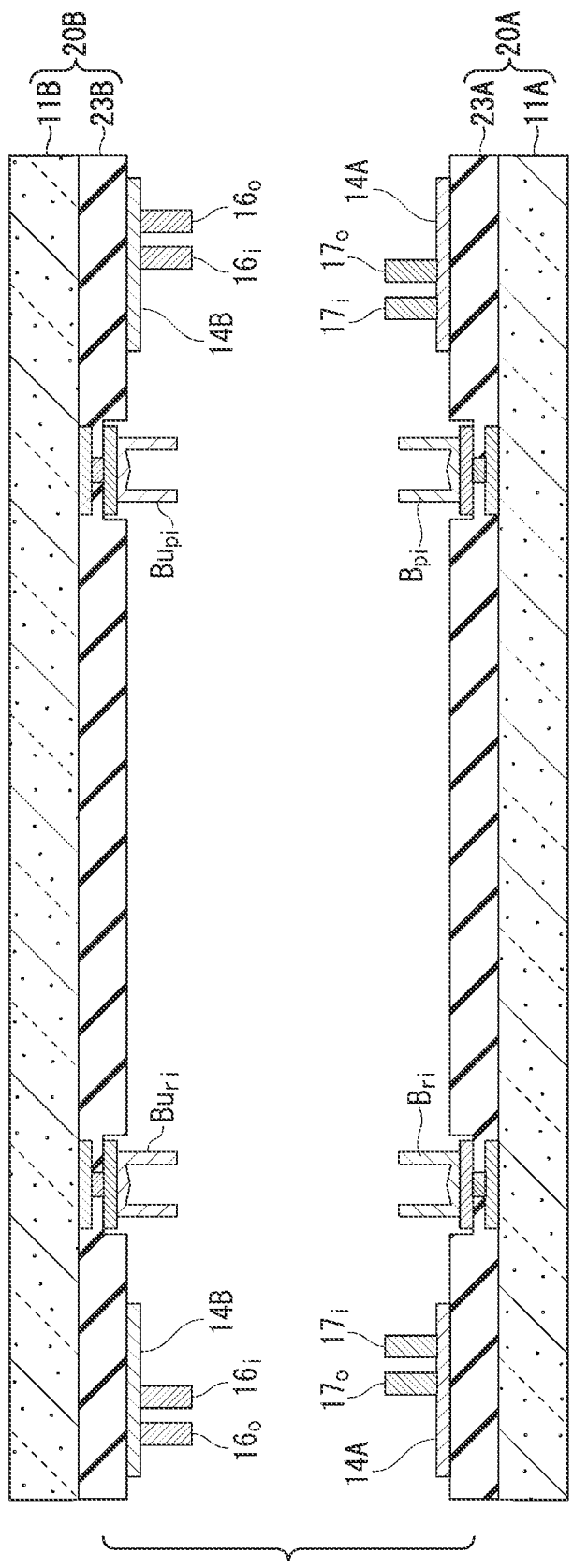
FIG. 9 is a cross-sectional view of the stacked semiconductor device pertaining to the second embodiment, representing a structural condition before the hermetical sealing.

Similarly to the planar pattern illustrated in FIG. 2, FIG. 8 exemplifies an architecture in which in the inside area of the rectangular frame-shaped pattern implemented by the first sealing-land pattern 14A, a plurality of lower-bumps $B_{ij}$ (i=p, q, r and s: j=a positive integer of 1 to n or 1 to m) is aligned at a pitch of ten micrometers or less along a rectangular frame-shaped pattern. Also, similarly to those illustrated in FIG. 3, FIG. 7 exemplifies an architecture in which in the inside area of the orbiting pattern of the second sealing-land 14B of the upper chip 20B, a plurality of hollow square-cylindrical upper-bumps $B_{uij}$ is aligned at a pitch of ten micrometers or less, along a rectangular frame-shaped pattern.

The lower semiconductor substrate 11A and the upper semiconductor substrate 11B are, for example, silicon substrates. At and in the surface of the lower semiconductor substrate 11A, the lower integrated circuit is merged, and, at and in the surface of the upper semiconductor substrate 11B, the upper integrated circuit is merged. For example, each of the lower and upper integrated circuits has circuits or circuit blocks such as memories, arithmetic operational circuits, control circuits, input/output circuits, sensing circuits, amplifiers and others. For the lower insulating film 23A and the upper insulating film 23B, for example, it is possible to adopt the inorganic insulating films such as $SiO_2$, $Si_3N_4$, BSG, SiOF, SiOC films and others. Furthermore, it is possible to adopt the organic insulating films such as SiCOH film, HSQ film, porous methyl silsesquioxane film, poly arylene film and others for the lower insulating film 23A and the upper insulating film 23B. And it is also possible to construct a multi-level interconnection-insulator of various multi-level schemes, by combining and laminating the above mentioned various insulating films. Each of the lower insulating film 23A and the upper insulating film 23B may be made by a single layer implemented by a single field insulating film, or may be made by a multi-level structure, in which the above mentioned various insulating films are combined. In the case of the multi-level structure, the top layer can serve as the passivation film. The top surfaces of the lower insulating film 23A and the upper insulating film 23B are desired to be planarized at a high precision, by polishing method such as CMP.

Figure 11A:
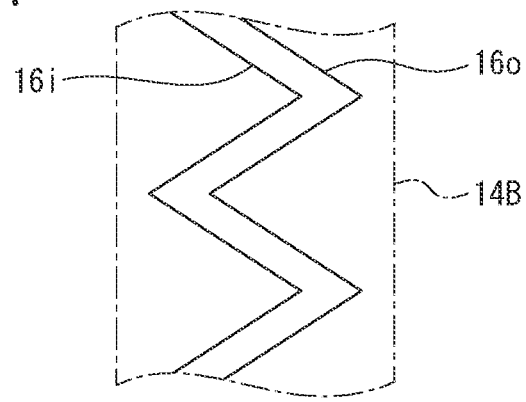
FIG. 11A is a plan view illustrating a topology of a saw-tooth meander-line, which zigzags on the upper chip of the stacked semiconductor device pertaining to the second embodiment.
Figure 11B:
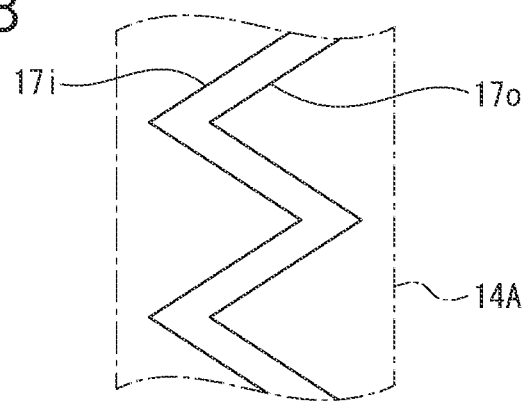
FIG. 11B is a plan view illustrating a topology of a saw-tooth meander-line, which zigzags on the lower chip adapted for mounting the upper chip in FIG. 11A.
Figure 11C:
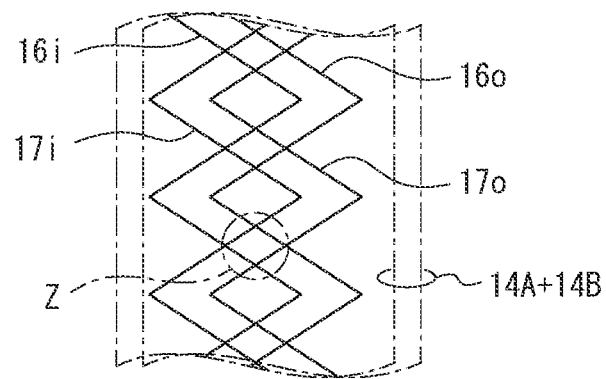
FIG. 11C is a plan view explaining that a plurality of metallurgical bonding portions is periodically arranged, each of the bonding portions is assigned by the positions of the intersections between the saw-tooth meander-lines of the upper and lower chips.

The rough profiles of the outer sealing-wall $16_o$ and the inner sealing-wall $16_i$ of the upper chip 20B, which delineate shapes of closed loops, respectively, are sketched out respectively in FIG. 7. Namely, a couple of two snaking lines, or the meandering outer sealing-wall $16_o$ and the meandering inner sealing-wall $16_i$, is supposed to go around the periphery of the upper chip 20B. FIG. 11A illustrates the details of the line topologies in which the outer sealing-wall $16_o$ and the inner sealing-wall $16_i$ wind and turn as the couple of saw-tooth meander-lines, respectively, in the planar pattern. As illustrated in FIG. 8, each of the outer sealing-wall $17_o$ and the inner sealing-wall $17_i$ of the lower chip 20A delineates a shape of closed meander-line, in a pattern in which a couple of lines orbits, while each of the lines winds and turns as a planar pattern, and goes around the periphery of the lower chip 20A FIG. 11B illustrate the details of the structure in which the outer sealing-wall $17_o$ and the inner sealing-wall $17_i$ repeatedly twist as the couple of saw-tooth meander-lines, respectively, as planar patterns. The couple of saw-tooth meander-lines illustrated in FIG. 11A and the couple of saw-tooth meander-lines illustrated in FIG. 11B differ from each other in spatial phase. Thus, as illustrated in FIG. 11C, the outer sealing-wall $16_o$ intersects with the outer sealing-wall $17_o$ and the inner sealing-wall $17_i$ of the lower chip 20A at a plurality of locations, and the inner sealing-wall $16_i$ of the upper chip 20B intersects with the outer sealing-wall $17_o$ and the inner sealing-wall $17_i$ of the lower chip 20A at a plurality of locations. In FIG. 11C, a second intersection site from the top is surrounded by a circle, and a symbol "Z" is labeled.

When both of the outer sealing-wall $16_o$ and the inner sealing-wall $16_i$ of the upper chip 20B are set to be a couple of straight parallel lines, and when both of the outer sealing-wall $17_o$ and the inner sealing-wall $17_i$ of the lower chip 20A are set to be a couple of straight parallel lines, the outer sealing-wall $16_o$ shall overlap with the outer sealing-wall $17_o$ on a same line, and the inner sealing-wall $17_i$ shall overlap with the inner sealing-wall $16_i$ on a same line. Thus, a larger force is required when the outer sealing-wall $16_o$ and others are collapsed. Also, necessary forces for breaking down the structure of the outer sealing-wall $16_o$ and others are changed, due to a positional misalignment of the outer sealing-wall $16_o$ to the outer sealing-wall $17_o$ and a positional misalignment of the inner sealing-wall $17_i$ to the inner sealing-wall $16_i$, when the outer sealing-wall $16_o$ and the inner sealing-wall $16_i$ are mated to the outer sealing-wall $17_o$ and the inner sealing-wall $17_i$. Also, chip-repair process is assumed to be performed in a case that any fault is discovered in the lower chip 20A or the upper chip 20B, when electrical performances are evaluated from a provisional connection test between the lower chip 20A and the upper chip 20B. In a situation when the chip-repair process shall be considered, there is a requirement such that the fault-discovered chip can easily removed with weaker force, by temporally connecting the lower chip 20A to the upper chip 20B with weaker force.

As illustrated in FIGS. 11A and 11B, for a configuration that the upper and lower sealing walls meander in the shapes of saw-tooth-waves, if the lower chip 20A is jointed to the upper chip 20B as illustrated in FIG. 11C, the intersection site Z can be defined for a provisional bonding at arbitrary intersection points, even if misalignment is generated at the intersection site Z. Thus, there is a technical advantage that a pressure to be applied at a process of thermal-compression-bonding can be set uniform. Moreover, since the intersection sites can be defined as a set of point contacts, the pressure to be applied at the time of thermal-compression-bonding can be made weaker. Thus, there is a technical advantage that the repairing work can be performed easily. By the way, although FIGS. 11A and 11B exemplify a situation in which both the upper and lower sealing walls snake, only one of the sealing-walls on lower chip 20A and the upper chip 20B may be made to snake. In the topology that only one of the sealing-walls either on lower chip 20A or the upper chip 20B meanders, there is an effectiveness that, even if the misalignment is generated, due to the technical merit of the point-contact bonding, the pressure to be applied at the time of thermal-compression-bonding can be made uniform. Therefore, the effectiveness that the repairing work becomes easy can be achieved, even in the topology that only one of the sealing-walls either on lower chip 20A or the upper chip 20B meanders.

Each of the planar pattern of the outer sealing-wall $16_o$, inner sealing-wall $16_i$, outer sealing-wall $17_o$ and the inner sealing-wall $17_i$ of the stacked semiconductor device pertaining to the second embodiment is preferred to be closed-loop topology, in the orbiting meandering pattern. However, a case is not excluded in which a part of the meander-line is cut to the extent that the interruption does not affect the hermetical sealing. The parallel-and-vertical wall-structure ($16_o$, $16_i$) for sealing and the parallel-and-vertical wall-structure ($17_o$, $17_i$) for sealing, which orbit with the meandering flat-line patterns, being applied to the stacked semiconductor device pertaining to the second embodiment, can be easily fabricated by the sidewall technique, similarly to the stacked semiconductor device of the first embodiment. The parallel-and-vertical wall-structure ($16_o$, $16_i$) for sealing can be provided by the same process as the building step of the upper-bump $B_{uij}$, by employing the known sidewall process that adopts meander-line-shaped groove or meander-line-shaped base pattern. Thus, the parallel-and-vertical wall-structure ($16_o$, $16_i$) for sealing can be manufactured at lower cost, without increasing the number of the extra steps when the parallel-and-vertical wall-structure ($16_o$, $16_o$) for sealing are fabricated. Also, the parallel-and-vertical wall-structure ($17_o$, $17_i$) for sealing can be provided by the same process as the building step of the lower-bump $B_{ij}$ by employing the known sidewall process that adopts the meander-line-shaped groove or meander-line-shaped base pattern. Thus, the parallel-and-vertical wall-structure ($17_o$, $17_i$) for sealing can be manufactured at lower cost, without increasing the number of the extra steps when the parallel-and-vertical wall-structure ($17_o$, $17_i$) for sealing are fabricated.

For the materials of the hollow square-cylindrical upper-bump $B_{uij}$, the metallic material is preferred, which has a property such that, by the pressure of the thermal-compression-bonding under normal pressure or reduced pressure or the ultrasonic thermal-compression-bonding, the surface of the metallic material can be easily bonded to the hollow-cylindrical lower-bump $B_{ij}$ by the solid-phase diffusion. Similarly, for the outer sealing-wall $16_o$ and the inner sealing-wall $16_i$ of the upper chip 20B, the metallic material is preferred, which has a property such that, by the thermal-compression-bonding or the ultrasonic thermal-compression-bonding, the surface of the metallic material can be easily bonded to the outer sealing-wall $17_o$ and the inner sealing-wall $17_i$ of the lower chip 20A, respectively, by the solid-phase diffusion. The outer sealing-wall $16_o$ and the inner sealing-wall $16_i$ may be made of the same material as the upper-bump $B_{uij}$, and the outer sealing-wall $17_o$ and the inner sealing-wall $17_i$ may be made of the same material as the lower-bumps $B_{ij}$. For example, Au or Au-alloy such as Au—Si, Au—Ge, Au—Sb, Au—Sn, Au—Pb, Au—Zn, Au—Cu et al. can be elected for the upper-bumps $B_{uij}$, the outer sealing-wall $16_o$, the inner sealing-wall $16_i$, the outer sealing-wall $17_o$ and the inner sealing-wall $17_i$ under a condition that the lower-bump $B_{ij}$ and the first sealing-land 14A are made of Au or Au-alloy.

When the thermal-compression-bonding process is executed on the outer sealing-wall $17_o$ and the inner sealing-wall $17_i$ of the lower chip 20A, the outer sealing-wall $16_o$ and the inner sealing-wall $16_i$ of the upper chip 20B are mutually deformed and bonded to each other through the solid-phase diffusion so as to establish the metallurgically jointed state, thereby achieving the hermetical sealing. Since each of the outer sealing-wall $16_o$, the inner sealing-wall $16_i$, the outer sealing-wall $17_o$ and the inner sealing-wall $17_i$ is prepared as the sidewall pattern whose thickness is about 70 to 700 nanometers, preferably about 100 to 300 nanometers, it is possible to take merit of the technical feature that each of the outer sealing-wall $16_o$, the inner sealing-wall $16_i$, the outer sealing-wall $17_o$ and the inner sealing-wall $17_i$ can be easily deformed by the force at the time of compression-bonding. The outer sealing-wall $16_o$ and the inner sealing-wall $16_i$ can be easily bonded to the outer sealing-wall $17_o$ and the inner sealing-wall $17_i$ by the solid-phase diffusion, because the quadruple sealing-walls are easily deformed by the force at the time of the compression-bonding. Thus, the hermetical sealing can be achieved without increasing the number of additional steps.

As illustrated in FIG. 9, bottoms of the outer sealing-wall $17_o$ and the inner sealing-wall $17_i$, which snake parallel to each other, are connected to each other. Thus, when a direction, in which the outer sealing-wall $17_o$ and the inner sealing-wall $17_i$ are snaking parallel to each other, is defined as a longitudinal direction, a cross-section vertical to the longitudinal direction of the lower sealing-pattern (14A, $17_o$ and $17_i$) exhibits a U-shaped topology. Also, bottoms of the outer sealing-wall $16_o$ and the inner sealing-wall $16_i$, which snake parallel to each other, are connected to each other. Thus, when a direction, in which the outer sealing-wall $16_o$ and the inner sealing-wall $16_i$ snaking parallel to each other, is defined as a longitudinal direction, a cross-section vertical to the longitudinal direction of the upper sealing-pattern (14B, $16_o$ and $16_i$) exhibits a U-shaped topology. Because the stacked semiconductor device pertaining to the second embodiment is explained as an example of architectures in which the first sealing-land 14A provided on the lower chip 20A is assumed to be the rectangular frame-shaped pattern, as illustrated in FIG. 8, the geometry of the second sealing-land 14B being arranged on the upper chip 20B shall correspond to the pattern of the first sealing-land 14A, and therefore, the geometry of the second sealing-land 14B implements a closed rectangular frame-shaped pattern almost analogous to the mirror image relationship with the first sealing-land 14A. However, when the first sealing-land 14A is not rectangular frame-shaped, it goes without saying that the second sealing-land 14B also implements the closed-loop planar pattern to which the shape of the first sealing-land 14A is projected.

As illustrated in FIG. 9, the first sealing-land 14A is a constituent member serving as a base strip for the outer sealing-wall $17_o$ and the inner sealing-wall $17_i$, configured to implement the U-shaped cross-section with the outer sealing-wall $17_o$ and the inner sealing-wall $17_i$. The first sealing-land 14A is preferable to have a sufficient strength and a necessary size. When the lower chip 20A and the upper chip 20B are hermetically sealed, pressures applied to the outer sealing-wall $17_o$ and the inner sealing-wall $17_i$ shall be absorbed and dispersed by the first sealing-land 14A. Therefore, the first sealing-land 14A is assumed to have the sufficient strength and the necessary size so that the damage such as crack and the like is not generated in the lower insulating film 23A. Similarly, the second sealing-land 14B is a constituent member serving as a base strip for the outer sealing-wall $16_o$ and the inner sealing-wall $16_i$, which represents a U-shaped cross-section with the outer sealing-wall $16_o$ and the inner sealing-wall $16_i$. The second sealing-land 14B is preferable to have a sufficient strength and a necessary size so that the pressures applied to the outer sealing-wall $16_o$ and the inner sealing-wall $16_i$ can be absorbed and dispersed, and therefore, the damage such as crack and the like is not generated in the upper insulating film 23B, when the lower chip 20A and the upper chip 20B are hermetically sealed. Therefore, the first sealing-land 14A and the second sealing-land 14B can have the multi-level structure of Au or Au-alloy, including the underlying layer made of refractory metal, for example, Ti, Ni, Cr, Ta, Mn, Ru, W and the like.

Although illustration is omitted, by containing refractory metals, such as Ni, Cr, Ti and the like, in the lower bump-land serving as the base layer of the hollow-cylindrical lower-bump $B_{ij}$, the lower bump-land may be brought into contact with the bottom of the lower-bump $B_{ij}$. The lower bump-lands may be buried in the lower insulating film 23A constructing the multi-level interconnection-insulator, and the lower bump-lands and the lower-bumps $B_{ij}$ can be connected through via-plugs to each other. The lower bump-lands are electrically connected through via-plugs and others to the bonding pads serving as the input/output electrodes of the lower integrated circuit. Similarly, by containing refractory metals, such as Ni, Cr, Ti and the like, in the upper bump-land serving as the base layer (the upper layer in the orientation represented by FIG. 9) of the hollow square-cylindrical upper-bump $B_{uij}$, the upper bump-land may be brought into contact with the bottom of the upper-bump $B_{uij}$. The upper bump-lands may be buried in the upper insulating film 23B constructing the multi-level interconnection-insulator, and the upper bump-lands and the upper-bumps $B_{uij}$ can be connected through via-plugs to each other. The upper bump-lands are electrically connected through via-plugs and others to the bonding pads serving as the input/output electrodes of the upper integrated circuit.

As mentioned above, the lower sealing-pattern (14A, $17_o$ and $17_i$), which circle along the periphery of the lower chip 20A, implements a rectangular closed-loop pattern. And, the upper sealing-pattern (14B, $16_o$, and $16_i$), which go around the periphery of the upper chip 20B, implements another rectangular closed-loop pattern. Here, the upper sealing-pattern (14B, $16_o$, and $16_i$) is designed so as to mate the planar pattern of the lower sealing-pattern (14A, $17_o$ and $17_i$), and the upper and lower meander-lines periodically intersect at a plurality of locations. Since the intersection points are periodically assigned at many locations, it is possible to make the hermetical sealing more complete. Thus, according to the stacked semiconductor device pertaining to the second embodiment, even in the case that the semiconductor integrated circuit having the miniaturized planar pattern, in which the pitch intervals between input electrodes and between 2) output electrodes are ten micrometers or less is integrated, the metallurgical connector (14A, 14B and 18) can be made, by performing the compression-bonding of the lower sealing-pattern (14A, $17_o$ and $17_i$) to the upper sealing-pattern (14B, $16_o$ and $16_i$) as illustrated FIG. 10. By implementing the metallurgical connector (14A, 14B and 18) encompassing the lower sealing-pattern (14A, $17_o$ and $17_i$) and the upper sealing-pattern (14B, $16_o$ and $16_i$), which are jointed by metallurgical bonding, it is possible to construct easily the hermetical sealed space between the lower chip 20A and the upper chip 20B at lower cost, without increasing the number of the process steps.

Figure 12A:
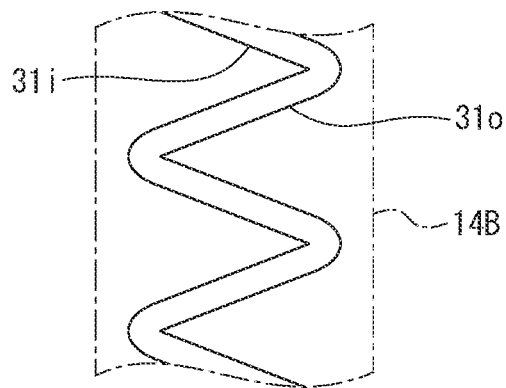
FIG. 12A is a plan view illustrating a topology of a corrugated meander-line deployed on an upper chip of a stacked semiconductor device pertaining to a first variation of the second embodiment.
Figure 12B:
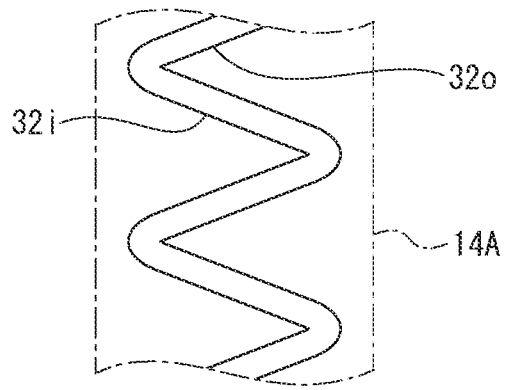
FIG. 12B is a plan view illustrating a topology of a corrugated meander-line snaking on a lower chip adapted for mounting the upper chip in FIG. 12A.
Figure 12C:
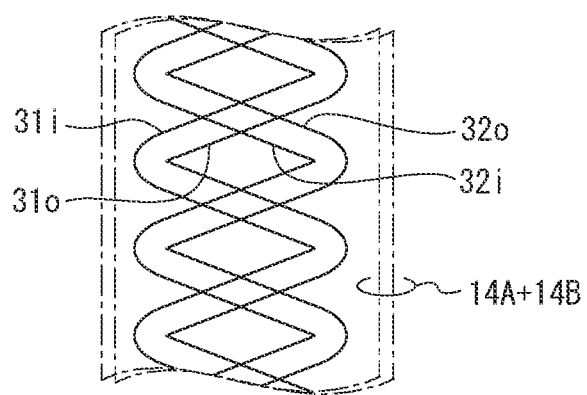
FIG. 12C is a plan view explaining that a plurality of metallurgical bonding portions is periodically arranged, each of the bonding portions is assigned by the positions of the intersections between the corrugated meander-lines of the upper and lower chips.

In addition, although FIGS. 11A to 11C have illustrated the topologies of the saw-tooth meander-lines that bend and turn sharply in straight zigzag manner, rounded topologies of parallel corrugated meander-lines (hereinafter referred as "corrugated-lines") as illustrated in FIGS. 12A to 12C can be adopted. FIG. 12A illustrates partial segments of planar patterns of an outer sealing-wall $31_o$ and an inner sealing-wall $31_i$, which are provided on an upper chip 20B of a stacked semiconductor device pertaining to a first variation of the second embodiment, referring to a pattern of the second sealing-land 14B. Although FIG. 12A merely represents a partial fragmentary pattern, the outer sealing-wall $31_o$ and the inner sealing-wall $31_i$ circle around the array of a plurality of upper-bumps $B_{uij}$, in which a couple of parallel corrugated-lines meander roundly at an equal interval, similarly to FIG. 7. Therefore, the closed-loop planar patterns are delineated in the whole scheme of macroscopic view, and the couple of parallel corrugated-lines orbit along the periphery of the upper chip 20B. FIG. 12B illustrates partial segments of patterns in which an outer sealing-wall $32_o$ and an inner sealing-wall $32_i$ of the lower chip 20A implement a couple of parallel corrugated-lines as planar patterns, which meander roundly and orbit, referring to a pattern of the lower chip 20A.

Although only the partial fragmentary pattern is represented, similarly to the planar layout-configuration illustrated in FIG. 8, a couple of parallel corrugated-lines illustrated in FIG. 12B circle around the array of a plurality of lower-bumps $B_{ij}$, keeping the equal interval. Therefore, the closed-loop planar patterns are delineated in the whole scheme of macroscopic view, and the couple of parallel corrugated-lines orbit along the periphery of the lower chip 20A. The couple of parallel corrugated-lines implemented by the outer sealing-wall $31_o$ and the inner sealing-wall $31_i$ illustrated in FIG. 12A and the couple of parallel corrugated-lines implemented by the outer sealing-wall $32_o$ and the inner sealing-wall $32_i$ illustrated in FIG. 12B differ from each other in spatial phase. Thus, as illustrated in FIG. 12C, the couple of parallel corrugated-lines implemented by the outer sealing-wall $31_o$ and the inner sealing-wall $31_i$ and the couple of parallel corrugated-lines implemented by the outer sealing-wall $32_o$ and the inner sealing-wall $32_i$ periodically intersect at a plurality of locations. Therefore, the intersect points, at which the upper and lower corrugated-lines are metallurgically jointed through the solid-phase diffusion, are arrayed periodically and successively, which improves the reliability of the hermitical sealing.

As illustrated in FIGS. 12A and 12B, in a case that the upper and lower sealing walls meander in corrugated manner, when the lower chip 20A and the upper chip 20B are jointed to each other as illustrated in FIG. 12C, intersection points can be automatically defined for the provisional bonding, even if misalignment is generated at the intersection site. Thus, there is a technical advantage that a pressure to be applied at the time of thermal-compression-bonding can be set uniform. Moreover, since the intersection site can be can be assigned to the point contact, the pressure to be applied at the time of thermal-compression-bonding can be made weak. Thus, there is a technical advantage that the repairing work can be easily performed. Although FIGS. 12A and 12B exemplify a situation in which both of the upper and lower sealing walls meander roundly, in a topology that only a couple of sealing walls, either on one of the lower chip 20A or the upper chip 20B, meanders, the similar effectiveness can be achieved. Namely, in a topology that only a couple of sealing walls on one of the lower chip 20A or the upper chip 20B meanders, because the pressure to be applied at the time of thermal-compression-bonding can be made uniform, due to the technical merit of the point-contact bonding, even if the misalignment is generated, the repairing work becomes easy.

Figure 13A:
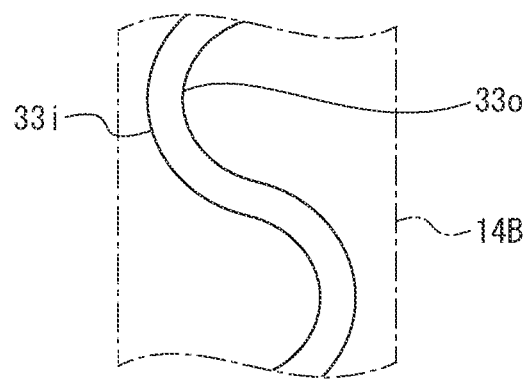
FIG. 13A is a plan view illustrating a topology of a semi-circular meander-line deployed on an upper chip of a stacked semiconductor device pertaining to a second variation of the second embodiment.
Figure 13B:
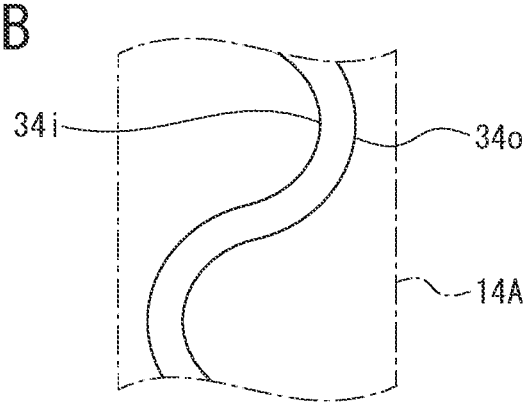
FIG. 13B is a plan view illustrating a topology of a semi-circular meander-line snaking on a lower chip adapted for mounting the upper chip in FIG. 13A.

In addition, although FIG. 11 has illustrated a topology of the parallel saw-tooth meander-lines, and FIG. 12 has illustrated a topology of the parallel corrugated-lines, topologies of parallel semi-circular meander-lines illustrated in FIGS. 13A to 13B are allowable. FIG. 13A illustrates partial segments of planar patterns of an outer sealing-wall $33_o$ and an inner sealing-wall $33_i$ of an upper chip 20B in a stacked semiconductor device pertaining to a second variation of the second embodiment, referring to a pattern of a second sealing-land 14B. Although FIG. 13A merely represents a partial fragmentary pattern, the outer sealing-wall $33_o$ and the inner sealing-wall $33_i$ circle around the array of the plurality of upper-bumps $B_{uij}$, in which a couple of semi-circular meander-lines snake in parallel, keeping the equal interval, similarly to FIG. 7. Therefore, the closed-loop planar patterns are delineated in the whole scheme of macroscopic view, and the couple of semi-circular meander-lines orbits along the periphery of the upper chip 20B. FIG. 13B illustrates a partial segment of a pattern in which an outer sealing-wall $34_o$ and an inner sealing-wall $34_i$ of the lower chip 20A implement a couple of semi-circular meander-lines in parallel as planar patterns, which orbit in a meandering topology, referring to a pattern of the lower chip 20A.

Figure 13C:
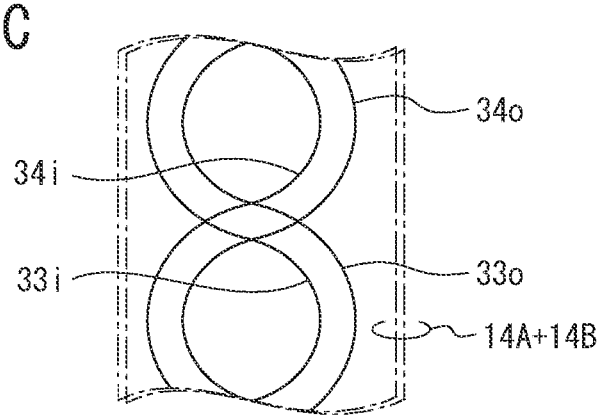
FIG. 13C is a plan view explaining that a plurality of metallurgical bonding portions is periodically arranged, each of the bonding portions is assigned by the positions of the intersections between the semi-circular meander-lines of the upper and lower chips.

Although only the partial fragmentary pattern is represented, similarly to the configuration illustrated in FIG. 8, a couple of semi-circular meander-lines illustrated in FIG. 13B circle around the array of a plurality of lower-bumps $B_{ij}$ in parallel with meandering topology, keeping the equal interval. Therefore, the closed-loop planar patterns are delineated in the whole scheme of macroscopic view, and the couple of semi-circular meander-lines orbit along the periphery of the lower chip 20A. The couple of parallel semi-circular meander-lines implemented by the outer sealing-wall $33_o$ and the inner sealing-wall $33_i$ illustrated in FIG. 13A and the couple of parallel semi-circular meander-lines implemented by the outer sealing-wall $34_o$ and the inner sealing-wall $34_i$ illustrated in FIG. 13B differ from each other in spatial phase. Thus, as illustrated in FIG. 13C, the couple of parallel semi-circular meander-lines implemented by the outer sealing-wall $33_o$ and the inner sealing-wall $33_i$ and the couple of parallel semi-circular meander-lines implemented by the outer sealing-wall $34_o$ and the inner sealing-wall $34_i$ periodically intersect at a plurality of locations. Therefore, the points, at which the upper and lower semi-circular meander-lines are metallurgically jointed through the solid-phase diffusion, are aligned periodically and successively. Then, the topology that the metallurgically jointed points are aligned periodically and successively can improve the reliability of the hermitical sealing.

In a scheme that the upper and lower sealing walls meander in cyclically inverted semi-circular topology as illustrated in FIGS. 13A and 13B, when the lower chip 20A and the upper chip 20B are jointed to each other as illustrated in FIG. 13C, intersection points can be automatically defined for the provisional bonding, even if misalignment of the lower chip 20A to the upper chip 20B is generated. Thus, there is a technical advantage that a pressure to be applied at the time of thermal-compression-bonding can be set uniform. Moreover, since the intersection sites can serve as the point-contact sites, the pressure to be applied at the time of thermal-compression-bonding can be made weak. Thus, there is a technical advantage that the repairing work can be easily performed. Although FIGS. 13A and 13B exemplify a situation in which both the upper and lower sealing walls meander, in a topology that only one of the couples of sealing walls on the lower chip 20A or the upper chip 20B is made to meander, the similar effectiveness can be achieved. Namely, in a topology that only one of the couples of sealing walls on the lower chip 20A or the upper chip 20B meanders, the pressure to be applied at the time of thermal-compression-bonding can be made uniform due to the technical merit of the point-contact bonding. Therefore, an effectiveness that repairing work becomes easy can be achieved.

Third Embodiment

Figure 14:
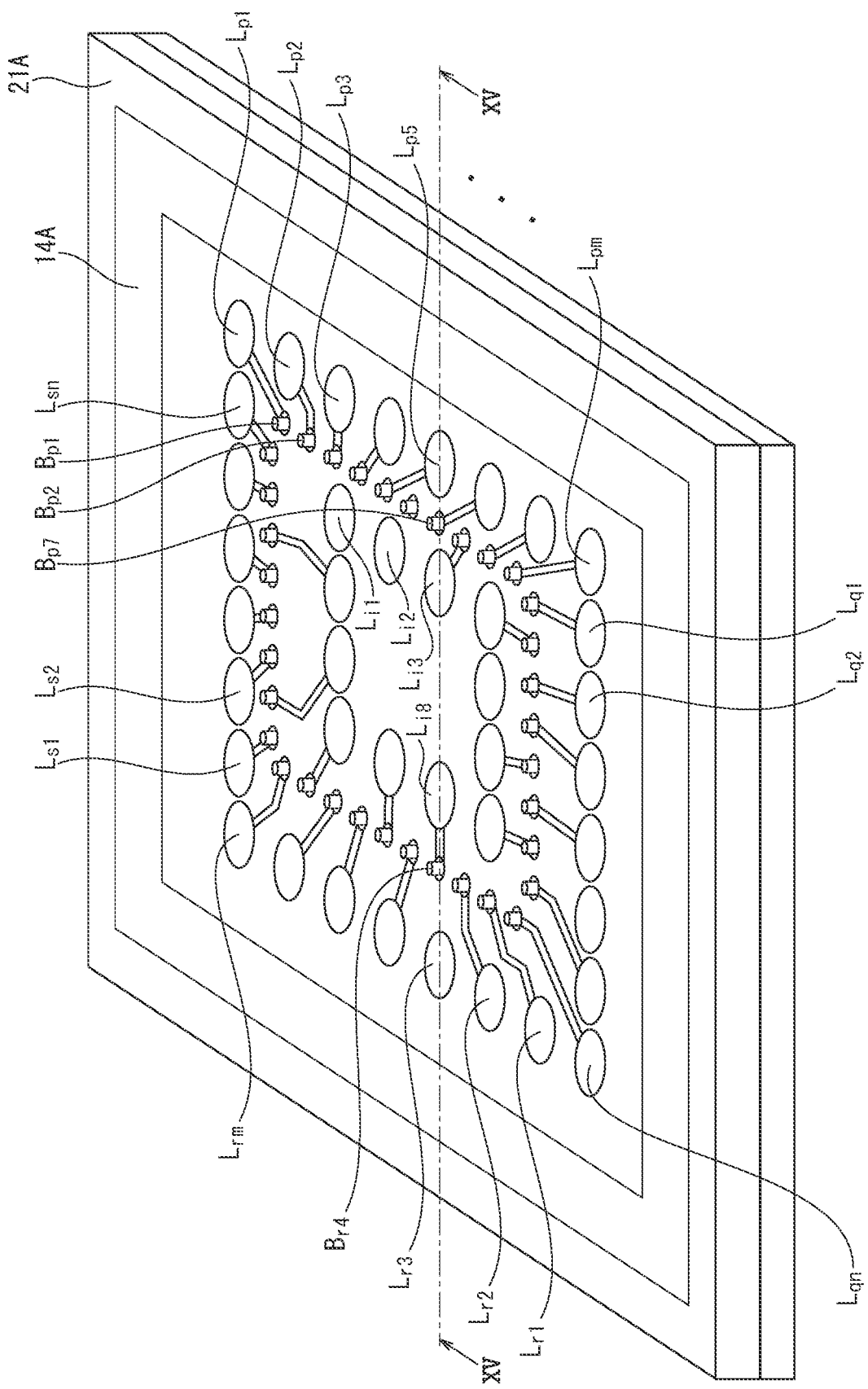
FIG. 14 is a bird's-eye view explaining a part of a configuration of a stacked semiconductor device pertaining to a third embodiment of the present invention, illustrating an example in which a lower chip serves as an interposer.
Figure 15:
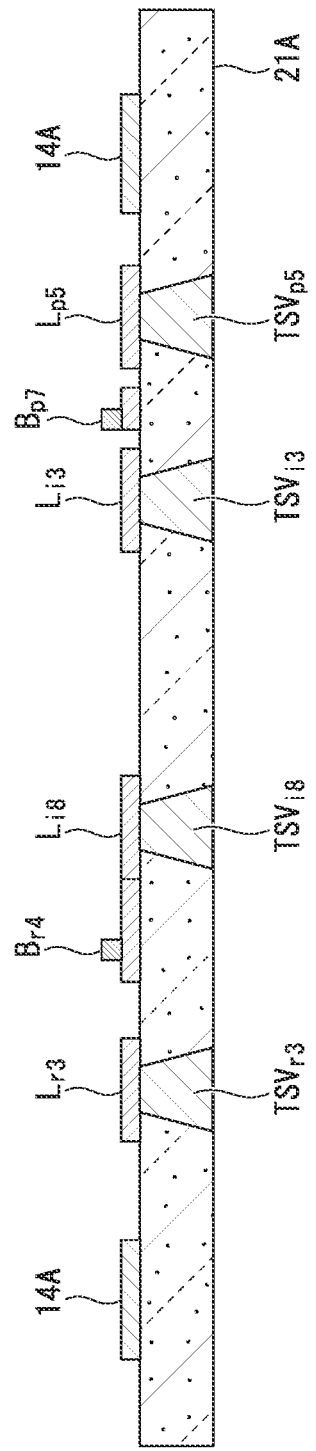
FIG. 15 is a cross-sectional view explaining the lower chip, which serves as the interposer illustrated in FIG. 14.

In a stacked semiconductor device pertaining to a third embodiment of the present invention, another architecture will be exemplified, in which a lower chip 21A serving as an interposer is prepared, and a stacked structure is implemented by the lower chip 21A and an upper chip provided on the lower chip 21A. As illustrated in FIGS. 14 and 15, the lower chip 21A encompasses a silicon substrate of high resistivity or semi-insulating and a strip-shaped lower sealing-pattern 14A orbiting along a periphery of a principal surface of the silicon substrate. Differently from the stacked semiconductor devices of the first and second embodiments, because the lower chip 21A serves as the interposer, semiconductor integrated circuits are not merged in the lower chip 21A In short, in the further lower-level side than the lower chip 21A illustrated in FIGS. 14 and 15, a different chip in which a semiconductor integrated circuit is merged is supposed to exist.

As illustrated in FIG. 15, the lower chip 21A of the stacked semiconductor device pertaining to the third embodiment includes a plurality of through silicon vias $TSV_{p5}$, $TSV_{i3}$, $TSV_{i8}$ and $TSV_{r3}$ penetrating through the silicon substrate. Because FIG. 15 is a cross-sectional view taken from XV-XV direction in FIG. 14, a part of the through silicon vias cut in the lower chip 21A is illustrated. The through silicon via $TSV_{p5}$ on the rightmost side is connected to an outer surface-land Ls provided on the surface of the lower chip 21A. The second through silicon via $TSV_{i3}$ from the right is connected to an inner surface-land $L_{i3}$ provided on the surface of the lower chip 21A, the third through silicon via $TSV_{i8}$ from the right is connected to another inner surface-land $L_{i8}$ provided on the surface of the lower chip 21A, and the inner surface-land $L_{i8}$ is connected through a surface wiring provided on the surface of the lower chip 21A to a lower-bump $B_{r3}$. The through silicon via $TSV_{r3}$ at a left end is connected to another outer surface-land $L_{r3}$ provided on the surface of the lower chip 21A.

By the way, according to the structure of the lower chip 21A in the stacked semiconductor device pertaining to the third embodiment, it is allowed that an interposer insulating film (lower insulating film) is laminated on the principal surface of the silicon substrate, and the strip-shaped lower sealing-pattern 14A is provided, which goes around the periphery of the principal surface of the silicon substrate, on the interposer insulating film. The lower chip 21A as the interposer is electrically connected to input/output electrodes of the integrated circuit provided in the further lower-level than the lower chip 21A. And therefore, the further lower-level chip disposed beneath of the lower chip 21A, the lower chip 21A and the upper chip mounted on the lower chip 21A implement the stacked semiconductor device of three-dimensional structure. The integrated circuit merged in the further lower-level chip disposed beneath the lower chip 21A may be a miniaturized integrated circuit, delineated by design rule of three to seven nanometers, similarly to the first to fourth embodiments. However, as can be understood from FIG. 14, since the interposer has a function of pitch changing element of the input/output electrodes, the integrated circuit merged in the further lower-level chip disposed beneath the lower chip 21A can have a relatively rough planar pattern, which is designed by design rule of ten nanometers or more. By the way, because FIG. 14 exemplifies an architecture in which the lower chip 21A is rectangular, the strip-shaped lower sealing-pattern 14A also implements a closed rectangular frame-shaped pattern (open structure of rectangular rim) along the periphery of the lower chip 21A. However, under a condition that the lower chip 21A is not rectangular, it goes without saying that the lower sealing-pattern 14A becomes a planar closed-loop pattern suitable for the shape of the lower chip 21A.

As illustrated in FIG. 14, in an inside area of the orbiting pattern of the lower sealing-pattern 14A of the lower chip 21A in the stacked semiconductor device pertaining to the third embodiment, the lower-bumps $B_{ij}$ are aligned at a pitch of ten micrometers or less. Circular outer surface-lands 41, $L_{p1}$, $L_{p2}$, $L_{p3}$, - - - , $L_{pm}$ are arrayed along the right side of the lower chip 21A. Through silicon vias, including other through silicon vias whose illustrations are omitted in FIG. 15, are disposed just under the outer surface-lands $L_{p1}$, $L_{p2}$, $L_{p3}$, - - - , $L_{pm}$, and each of the through silicon vias is connected to the counterpart outer surface-lands, respectively, to which each of the through silicon vias disposed just under the outer surface-lands $L_{p1}$, $L_{p2}$, $L_{p3}$, - - - , $L_{pm}$ corresponds respectively. That is, the outer surface-lands $L_{pj}$ are independently connected to the counterpart through silicon vias $TSV_{pj}$, respectively. Accordingly, each of the outer surface-lands $L_{pj}$ is electrically connected to one of the input/output electrodes of the semiconductor integrated circuit, disposed at further lower-level than the lower chip 21A, and implement a part of the three-dimensional structure. The outer surface-lands $L_{p1}$, $L_{p2}$ and $L_{p3}$ are connected to the lower-bumps $B_{p1}$, $B_{p2}$ and $B_{p3}$, respectively, by corresponding surface wirings, and the outer surface-lands $L_{pj}$ are connected to the counterpart lower-bumps $B_{pm}$, respectively. However, there may be outer surface-lands $L_{pj}$ that are not connected to the lower-bumps $B_{ij}$ as illustrated in FIG. 14.

According to the lower chip 21A in the stacked semiconductor device pertaining to the third embodiment, when a side in a direction of the array of the outer surface-lands $L_{p1}$, $L_{p2}$, $L_{p3}$, - - -, $L_{pm}$ is defined as "the first side", circular outer surface-lands $L_{q1}$, $L_{q2}$, $L_{q3}$, - - - - , $L_{qn}$ are arrayed around a central area of the lower chip 21A, along a second side that is continuous with the first side and orthogonal to the first side. The through silicon vias, including other through silicon vias whose illustrations are omitted in FIG. 15, are disposed just under the outer surface-lands $L_{p1}$, $L_{p2}$, $L_{p3}$, - - - , $L_{pm}$, and connected to the counterpart outer surface-lands, respectively, to which each of the through silicon vias just under the outer surface-lands $L_{p1}$, $L_{p2}$, $L_{p3}$, - - - , $L_{pm}$ corresponds, respectively. That is, the outer surface-land $L_{qj}$ is independently connected to the counterpart through silicon vias $TSV_{qj}$. Accordingly, the outer surface-land $L_{qj}$ is electrically connected to one of the input/output electrodes of the semiconductor integrated circuit, disposed at further lower-level than the lower chip 21A, and implement a part of the three-dimensional structure. There are the outer surface-land $L_{qj}$ that is connected to the lower-bump $B_{qj}$ and remaining outer surface-land $L_{qj}$ that is not connected to the lower-bump $B_{ij}$. Circular outer surface-lands $L_{r1}$, $L_{r2}$, $L_{r3}$, - - - , $L_{rm}$ are arrayed around the central area of the lower chip 21A, along a third side of a rectangular pattern that is continuous with the second side and orthogonal to the second side.

The through silicon vias, including other through silicon vias whose illustrations are omitted in FIG. 15, are disposed just under outer surface-lands $L_{r1}$, $L_{r2}$, $L_{r3}$, - - - , $L_{rm}$, and connected to the counterpart outer surface-lands, respectively, to which each of the through silicon vias just under the outer surface-lands $L_{r1}$, $L_{r2}$, $L_{r3}$, - - - , $L_{rm}$ corresponds, respectively. That is, the outer surface-land $L_{rj}$ is connected to the counterpart through silicon vias $TSV_{rj}$. Accordingly, the outer surface-land $L_{rj}$ is electrically connected to one of the input/output electrodes of the semiconductor integrated circuit, disposed at further lower-level than the lower chip 21A, and implement a part of the three-dimensional structure. There are the outer surface-lands $L_{rj}$ that are connected to the lower-bump $B_{rj}$, and remaining outer surface-lands $L_{rj}$ that are not connected to the lower-bump $B_{rj}$.

Circular outer surface-lands $L_{s1}$, $L_{s2}$, $L_{s3}$, - - - , $L_{sm}$ are arrayed around the central area of the lower chip 21A, along a fourth side that is continuous with the third side and orthogonal to the third side. The through silicon vias, including other through silicon vias whose illustrations are omitted in FIG. 15, are disposed just under the outer surface-lands $L_{s1}$, $L_{s2}$, $L_{s3}$, - - - , $L_{sm}$, and connected to the counterpart outer surface-lands, respectively, to which each of the through silicon vias just under the outer surface-lands $L_{s1}$, $L_{s2}$, $L_{s3}$, - - - , $L_{sm}$ corresponds, respectively. That is, the outer surface-land $L_{sj}$ is connected to the counterpart through silicon vias $TSV_{sj}$. Accordingly, the outer surface-land $L_{sj}$ is electrically connected to one of the input/output electrodes of the semiconductor integrated circuit, which is disposed at a further lower-level, and implement a part of the three-dimensional structure. There are the outer surface-land $L_{sj}$ that is connected to the lower-bump $B_{sj}$ and remaining outer surface-land $L_{sj}$ that is not connected to the lower-bump $B_{sj}$. As illustrated in FIG. 14, circular inner surface-lands $L_{i1}$, $L_{i2}$, $L_{i3}$, - - - are arrayed in the inside area of the rectangular array of the lower-bumps $B_{ij}$. The through silicon vias, including other through silicon vias whose illustrations are omitted in FIG. 15, are disposed just under the inner surface-lands $L_{i1}$, $L_{i2}$, $L_{i3}$, - - - , and connected to the inner surface-lands, respectively, to which each of the through silicon vias just under the inner surface-lands $L_{i1}$, $L_{i2}$, $L_{i3}$, - - - corresponds, respectively. That is, the inner surface-land $L_{ik}$ is connected to the counterpart through silicon vias $TSV_{ik}$. Accordingly, each of the inner surface-lands $L_{ik}$ is electrically connected to one of the input/output electrodes of the semiconductor integrated circuit, which is disposed at a further lower-level, and implement a part of the three-dimensional structure. There are the inner surface-lands $L_{ij}$ that are connected to the lower-bumps $B_{ij}$ and remaining inner surface-lands $L_{ik}$ that are not connected to the lower-bumps $B_{ij}$.

Similarly to the explanation in the stacked semiconductor device of the first embodiment, an upper chip of the stacked semiconductor device pertaining to the third embodiment encompasses an upper sealing-pattern (14B, $15_o$ and $15_i$), which serves as a rectangular closed-loop pattern orbiting along the periphery of the upper chip, although the illustration is omitted. The layout of the upper sealing-pattern (14B, $15_o$ and $15_i$) is designed so as to mate the planar pattern of the lower sealing-pattern 14A of the lower chip 21A, which serves as the interposer. As explained in the stacked semiconductor devices of the first and second embodiments, the upper sealing-pattern (14B, $15_o$ and $15_i$) whose illustration is omitted can be implemented by the same process as the formation of the upper-bumps $B_{uij}$. Thus, manufacturing of the upper sealing-pattern (14B, $15_o$ and $15_i$) does not lead to any increase of the process steps. Thus, according to the stacked semiconductor device pertaining to the third embodiment, even in a case of the stacked semiconductor device having the miniaturized planar pattern, whose pitch intervals between input electrodes and between output electrodes of the integrated circuit merged in the upper chip is ten micrometers or less, the metallurgical connector (14A, $15_o$ and $15_i$) similar to the example illustrated in FIG. 6 can be constructed, by performing the compression-bonding of the lower sealing-pattern 14A to the upper sealing-pattern (14B, $15_o$ and $15_i$). And, the metallurgical connector (14A, $15_o$ and $15_i$) establishes the metallurgically bonding between the lower sealing-pattern 14A and the upper sealing-pattern (14B, $15_o$ and $15_i$). Hence, even if the lower chip 21A is the interposer, it is possible to easily implement the stacked semiconductor device of the three-dimensional structure, by performing the hermetical sealing between the lower chip 21A and the upper chip, without increasing the number of the process steps.

Fourth Embodiment

Figure 16:
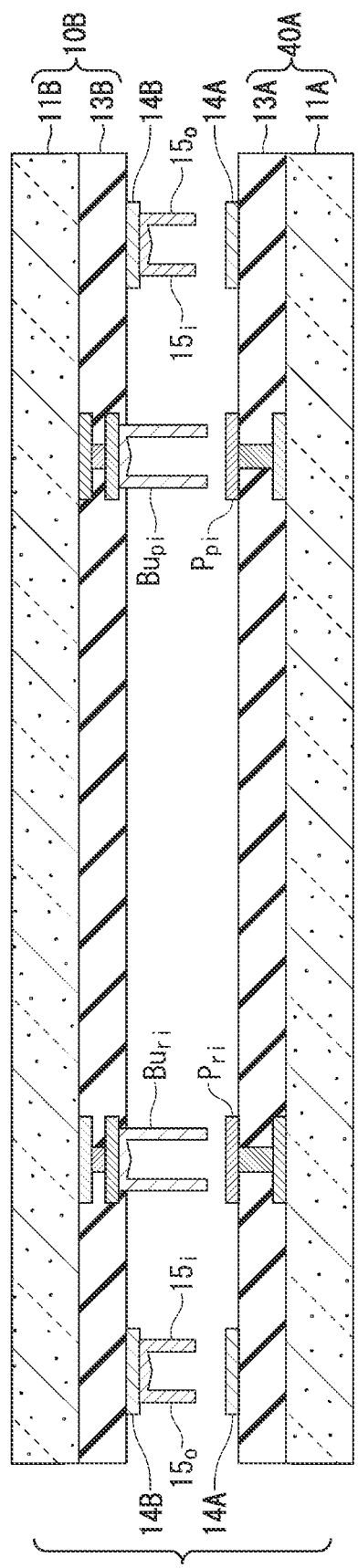
FIG. 16 is a view explaining a structural condition before hermetical sealing process of a stacked semiconductor device pertaining to a fourth embodiment of the present invention.

In the stacked semiconductor devices pertaining to the first to third embodiments of the present invention, various examples are explained in which the upper-bumps $B_{uij}$ made of Au or Au-alloy that are arrayed in the upper chip and the lower-bumps $B_{ij}$ made of Au or Au-alloy that are arrayed in the lower chip, the positions of the lower-bumps $B_{ij}$ correspond to the array of the upper-bumps $B_{uij}$. And, in the inside of the hermetical sealed space, which is implemented by the metallurgical connector disposed along the peripheries of the upper and lower chips, the upper-bumps $B_{uij}$ and the lower-bumps $B_{ij}$ are jointed to each other by the solid-phase diffusion. However, the joint scheme of the upper-bumps $B_{uij}$ and the lower-bumps $B_{ij}$ is merely the exemplification. It is allowed that either one of the upper-bumps $B_{uij}$ or the lower-bumps $B_{ij}$ implements the flat surfaces as bonding pads having shapes of parallel flat-plates. FIG. 16 illustrates a structure of a stacked semiconductor device pertaining to a fourth embodiment of the present invention at a stage prior to a hermetical sealing of the stacked semiconductor device. The structure of the stacked semiconductor device pertaining to a fourth embodiment of the present invention illustrated in FIG. 16 is similar to the stacked semiconductor device of the first embodiment, in that a lower chip 40A and an upper chip 10B, the upper chip 10B is mounted on the lower chip 40A, implement a stacked structure. Moreover, as illustrated in FIG. 16, the lower chip 40A is similar to the stacked semiconductor device pertaining to the stacked semiconductor device of the first embodiment, in that the lower chip 40A encompasses the lower semiconductor substrate 11A, the lower integrated circuit merged at and in the surface area of the principal surface of the lower semiconductor substrate 11A, the lower insulating film 13A covering the lower integrated circuit at and in the principal surface of the lower semiconductor substrate 11A, and the strip-shaped lower sealing-pattern 14A orbiting along the periphery of the principal surface of the lower semiconductor substrate 11A on the lower insulating film 13A.

However, on the cross-sectional view illustrated in FIG. 16, the configuration of the stacked semiconductor device pertaining to the fourth embodiment differs from the configuration of the stacked semiconductor device of the first embodiment, in that a bonding pad $P_{pi}$ and a bonding pad $P_{ri}$ are disposed on the lower chip 40A, in an inside area between the patterns of the lower sealing-patterns 14A which are arranged on both sides of the lower chip 40A. Each of the bonding pad $P_{pi}$ and the bonding pad $P_{ri}$ are illustrated as a pattern of a parallel flat-plate in the cross-sectional view. On the other hand, as illustrated in FIG. 16, the upper chip 10B of the stacked semiconductor device pertaining to the fourth embodiment is similar to the stacked semiconductor device of the first embodiment, with regard to the upper chip 10B, in that the upper chip 10B of the fourth embodiment encompasses the upper semiconductor substrate 11B, the upper integrated circuit merged at and in the surface area of the principal surface of the upper semiconductor substrate 11B, the upper insulating film 13B laminated on the principal surface of the upper semiconductor substrate 11B so as to cover the upper integrated circuit, the strip-shaped second sealing-land 14B orbiting along the periphery of the principal surface of the upper semiconductor substrate 11B on the upper insulating film 13B. The upper chip 10B of the fourth embodiment further encompasses the outer sealing-wall $15_o$ and the inner sealing-wall $15_i$, which extend parallel to each other, respectively, while being spaced apart from each other and adjacent to each other, along the periphery of the upper semiconductor substrate 11B on the second sealing-land 14B. On the cross-sectional view illustrated in FIG. 16, a structure is illustrated in which in an inside area of the patterns of the second sealing-lands 14B of the upper chips 10B arranged on both sides, an upper-bump $B_{upi}$ and an upper-bump $B_{urj}$ are arrayed so as to correspond the array positions of the bonding pad $P_{pi}$ and bonding pad $P_{ri}$ on the lower chip 40A.

The second sealing-land 14B, the outer sealing-wall $15_o$ and the inner sealing-wall $15_i$ implement "the upper sealing-pattern (14B, $15_o$ and $15_i$)" of the upper chip 10B in the stacked semiconductor device pertaining to the fourth embodiment. Although the illustration of the state after the bonding is omitted, similarly to the configuration illustrated in FIG. 6, the surfaces of the lower sealing-patterns 14A, and the upper sealing-patterns (14B, $15_o$ and $15_i$) are jointed to each other by the solid-phase diffusion. Accordingly, the metallurgical connectors are constructed, which implement a hermetical sealed space surrounded by the lower insulating film 13A, the upper insulating film 13B and the metallurgical connectors. Although the illustration of the planar pattern is omitted, similarly to the planar layout illustrated in FIG. 4, the cross-sectional view illustrated in FIG. 16 is illustrated, under an assumption that a plurality of bonding pads $P_{ij}$ (i=p, q, r and s: j=a positive integer of 1 to n or 1 to m) are arrayed in an open rectangle pattern, which is disposed in the inside area of the rectangular frame-shaped pattern implemented by the lower sealing-pattern 14A. Similarly, the cross-sectional view illustrated in FIG. 16 is illustrated under an assumption that a plurality of hollow square-cylindrical upper-bumps $B_{uij}$ are aligned along a rectangular frame-shaped pattern, in the inside area of the orbiting pattern of the second sealing-land 14B, on the upper chip 10B, similarly to the planar layout illustrated in FIG. 3.

For materials of the hollow square-cylindrical upper-bump $B_{uij}$, metallic material is preferred. The metallic material shall have a property such that, by the pressure of the thermal-compression-bonding under normal pressure or reduced pressure or the ultrasonic thermal-compression-bonding, the surface of the hollow square-cylindrical upper-bump $B_{uij}$ can be easily bonded to the surface of the hollow-cylindrical lower-bump $P_{ij}$ by the solid-phase diffusion. Similarly, for each of the outer sealing-wall $15_o$ and the inner sealing-wall $15_i$ of the upper chip 10B, metallic material is preferred, which has a property such that, by the thermal-compression-bonding or the ultrasonic thermal-compression-bonding, the surfaces of the outer sealing-wall $15_o$ and the inner sealing-wall $15_i$ can be easily bonded to the surface of the lower sealing-pattern 14A of the lower chip 40A by the solid-phase diffusion. The outer sealing-wall $15_o$ and the inner sealing-wall $15_i$ may be made of the same material as the upper-bump $B_{uij}$ and manufactured by the same process. The lower sealing-pattern 14A may be made of the same material as the bonding pad $P_{ij}$, and manufactured by the same process. For example, in a case that the bonding pad $P_{ij}$ and the lower sealing-pattern 14A are made of aluminum (Al) or Al-alloy such as Al—Si and the like, the bonding pad $P_{ij}$ and the lower sealing-pattern 14A can be manufactured by the same process. If the bonding pad $P_{ij}$ and the lower sealing-pattern 14A are made of the same Au or Au-alloy such as Au—Si, Au—Ge, Au—Sb and others, the bonding pad $P_{ij}$ and the lower sealing-pattern 14A can be manufactured by the same process. Similarly, by employing the same Au or Au-alloy for the upper-bump $B_{uij}$, the outer sealing-wall $15_o$ and the inner sealing-wall $15_i$, the upper-bump $B_{uij}$, the outer sealing-wall $15_o$ and the inner sealing-wall $15_i$ can be provided by the same process without increasing the number of steps.

As mentioned above, according to the stacked semiconductor device pertaining to the fourth embodiment, although the lower-bumps $B_{ij}$ employed in the stacked semiconductor device of the first embodiment has changed to the configuration of the flat surface, namely, the lower-bumps $B_{ij}$ has changed to the bonding pad $P_{ij}$ of the shape of parallel flat-plate, the metallurgically bonding can be achieved by performing the compression-bonding of the lower sealing-pattern 14A to the upper sealing-pattern (14B, $15_o$ and $15_i$). Through the metallurgical-bonding process, the metallurgical connectors can be constructed as illustrated in FIG. 16. Therefore, it is possible to establish easily the hermetical sealing between the lower chip 40A and the upper chip 10B at lower cost, without increasing the number of the process steps.

First Variation of Fourth Embodiment

Figure 17:
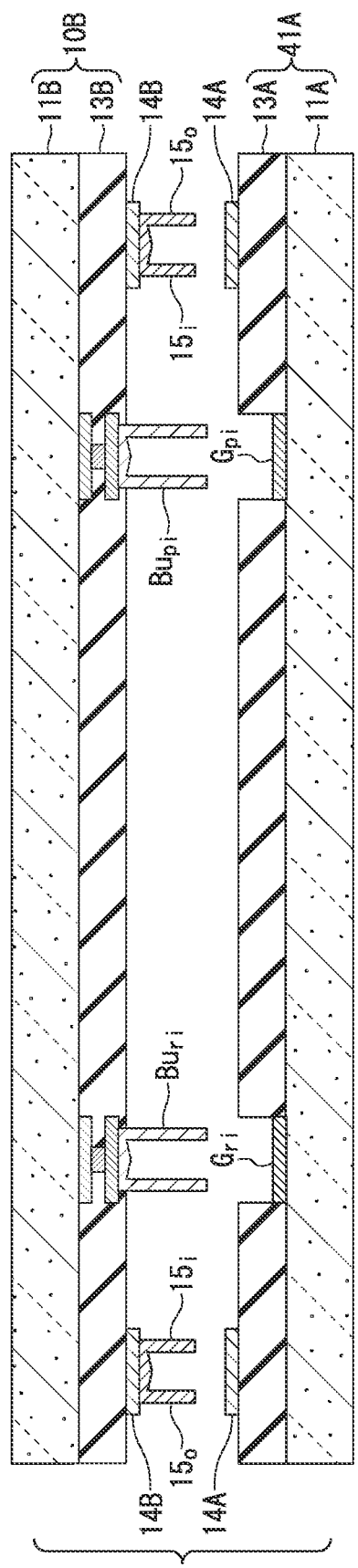
FIG. 17 is a view explaining a structural condition before hermetical sealing process of a stacked semiconductor device pertaining to a first variation of the fourth embodiment of the present invention.

FIG. 17 illustrates a structure prior to the hermetical sealing process of a stacked semiconductor device pertaining to a first variation of the fourth embodiment of the present invention. However, the structure illustrated in FIG. 17 is similar to the configuration of the stacked semiconductor device of the fourth embodiment illustrated in FIG. 16 in that the structure illustrated in FIG. 17 is a stacked structure, which encompasses a lower chip 41A and an upper chip 10B mounted on the lower chip 41A. However, the structure illustrated in FIG. 17 differs from the structure illustrated in FIG. 16 in that a bonding pad $G_{pi}$ and a bonding pad $G_{ri}$, each of which has the shape of parallel flat-plate, are disposed at a level of a surface (top surface) of the lower semiconductor substrate 11A, which is lower than a level of the surface (top surface) of the lower insulating film 13A laminated on the principal surface of the lower semiconductor substrate 11A. The lower chip 41A illustrated in FIG. 17 is similar to the structure illustrated in FIG. 16 in that the lower chip 41A encompasses the lower semiconductor substrate 11A, the lower integrated circuit merged at and in the surface area of the principal surface of the lower semiconductor substrate 11A, the lower insulating film 13A covering the lower integrated circuit at and in the principal surface of the lower semiconductor substrate 11A, and the strip-shaped lower sealing-pattern 14A orbiting along the periphery of the principal surface of the lower semiconductor substrate 11A on the lower insulating film 13A.

In the stacked semiconductor device of the fourth embodiment illustrated in FIG. 16, since the bonding pad $G_{pi}$ and the bonding pad $G_{ri}$ are disposed at the level of the top surface of the lower insulating film 13A, contact via-plugs were respectively required for the bonding pad $G_{pi}$ and the bonding pad $G_{ri}$. Namely, a contact via-plug has been required for connecting between an intermediate electrode (surface electrode) at the surface of the lower semiconductor substrate 11A and the bonding pad $G_{pi}$ at the top surface of the lower insulating film 13A, and furthermore, another contact via-plug has been required for connecting between another intermediate electrode (surface electrodes) at the surface of the lower semiconductor substrate 11A and the bonding pad $G_{ri}$ at the top surface of the lower insulating film 13A. On the contrary, in the stacked semiconductor device pertaining to the first variation of the fourth embodiment illustrated in FIG. 17, the contact via-plugs are not required, thereby making the structure illustrated in FIG. 17 much simpler than the structure illustrated in FIG. 16.

In the cross-sectional view illustrated in FIG. 17, in an inside area of the lower sealing-patterns 14A, which are arranged on both sides, the bonding pad $G_{pi}$ and the bonding pad $G_{ri}$ are disposed. The bonding pad $G_{pi}$ and the bonding pad $G_{ri}$ are built by the shapes of parallel flat-plates, and are in contact with the surface of the lower semiconductor substrate 11A.

As illustrated in FIG. 17, the upper chip 10B of the stacked semiconductor device pertaining to the first variation of the fourth embodiment encompasses an upper semiconductor substrate 11B, an upper integrated circuit merged in the surface region on the principal surface of the upper semiconductor substrate 11B, and an upper insulating film 13B laminated on the principal surface of the upper semiconductor substrate 11B so as to cover the upper integrated circuit. Moreover, similarly to the structure illustrated in FIG. 11B, the upper chip 10B encompasses a strip-shaped second sealing-land 14B orbiting along the periphery of the principal surface of the upper semiconductor substrate 11B on the upper insulating film 13B, and the outer sealing-wall $15_o$ and the inner sealing-wall $15_i$ which run parallel to each other, along the periphery of the upper semiconductor substrate 11B, on the second sealing-land 14B. Upper-bumps $B_{upi}$ are aligned correspondingly to the array positions of the bonding pads $G_{pi}$ of the lower chip 41A. Thus, through windows (contact holes) cut in the lower insulating film 13A, tips of the upper-bumps $B_{upi}$ are jointed to the surfaces of the bonding pads $G_{pi}$ by the solid-phase diffusion. Similarly, the upper-bumps $B_{uri}$ are aligned correspondingly to the array positions of the bonding pads $G_{ri}$ of the lower chip 41A. Thus, through another windows (contact holes) cut in the lower insulating film 13A, tips of the upper-bumps $B_{uri}$ are jointed to the surfaces of the bonding pads $G_{ri}$ by the solid-phase diffusion.

The lower sealing-pattern 14A delineates a rectangular closed-loop pattern orbiting along the periphery of the lower chip 41A, and the upper sealing-pattern (14B, $15_o$ and $15_i$) delineates another rectangular closed-loop pattern orbiting along the periphery of the upper chip 10B, the pattern of the upper sealing-pattern (14B, $15_o$ and $15_i$) is designed so as to mate the planar pattern of the lower sealing-pattern 14A in FIG. 17. The configuration of the lower sealing-pattern 14A, and the upper sealing-pattern (14B, $15_o$ and $15_i$) illustrated in FIG. 17 is similar to FIG. 16. However, according to the stacked semiconductor device pertaining to the first variation of the fourth embodiment illustrated in FIG. 17, although the bonding pad $G_{pi}$ and the bonding pad $G_{ri}$ are allocated at the surface level of the lower semiconductor substrate 11A, it is possible to achieve the electric connections between the lower integrated circuit merged in the lower chip 41A and the upper integrated circuit merged in the upper chip 10B, simultaneously when the hermetical sealing is performed between the lower sealing-pattern 14A and the upper sealing-pattern (14B, $15_o$ and $15_i$) through the metallurgical connectors.

Second Variation of Fourth Embodiment

Figure 18:
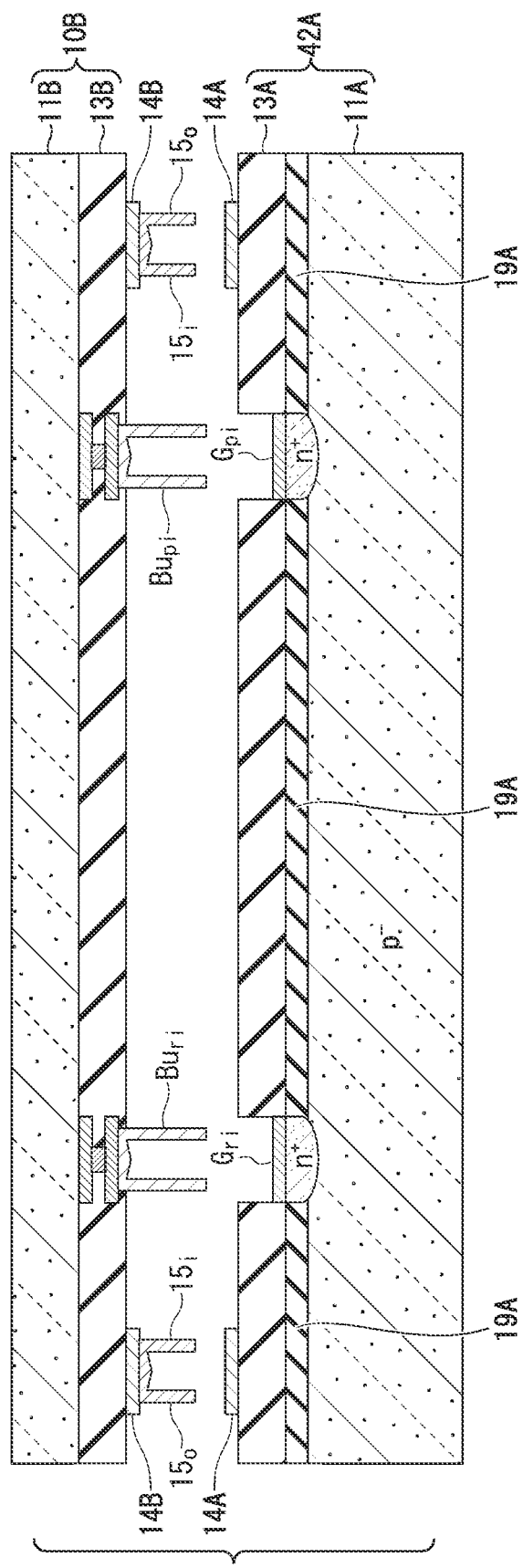
FIG. 18 is a view explaining a structural condition before hermetical sealing process of a stacked semiconductor device pertaining to a second variation of the fourth embodiment of the present invention.

FIG. 18 illustrates a structure at a stage prior to hermetical sealing process of a stacked semiconductor device pertaining to a second variation of the fourth embodiment of the present invention. However, structure illustrated in FIG. 18 is similar to the structure of the stacked semiconductor device of the first variation of the fourth embodiment illustrated in FIG. 17, in that the bonding pad $G_{pi}$ and the bonding pad $G_{ri}$ each of which has the shape of parallel flat-plate are provided at positions lower than the level of the surface (top surface) of the lower insulating film 13A, which is laminated on the principal surface of the lower semiconductor substrate 11A FIG. 18 illustrates schematically a lower integrated circuit encompassing $n^+$-regions which are buried at and in the principal surface of a p-type lower semiconductor substrate 11A. Although FIG. 18 illustrates a lower chip 41A merging the lower integrated circuit, the structure of the lower chip 41A is merely an exemplification, and it goes without saying that there are various modifications of the configurations of the lower integrated circuits and others. Structure illustrated in FIG. 18 differs from the structure of the stacked semiconductor device of the first variation of the fourth embodiment illustrated in FIG. 17, in that on the principal surface of the lower semiconductor substrate 11A, element-isolation insulating-films 19A exhibiting a shallow trench isolation (STI) structure are buried to surround the exemplified $n^+$-regions, and the lower insulating film 13A is laminated on the element-isolation insulating-films 19A If the $n^+$-regions are a plurality of localized semiconductor regions selectively buried in a p-well, the element-isolation insulating-films 19A exhibiting the STI structure shall be formed to surround the p-well. And, structure illustrated in FIG. 18 is similar to the structure illustrated in FIG. 17, in the configuration that the strip-shaped lower sealing-pattern 14A orbits along the periphery of the principal surface of the lower semiconductor substrate 11A, on the lower insulating film 13A.

According to the stacked semiconductor device pertaining to the second variation of the fourth embodiment illustrated in FIG. 18, similarly to the structure illustrated in FIG. 17, the contact via-plugs in FIG. 16 are not required, thereby making the structure illustrated in FIG. 18 much simpler than the structure illustrated in FIG. 16. The structure illustrated in FIG. 18 differs from the structure illustrated in FIG. 17 in that, the bonding pad $G_{pi}$ and the bonding pad $G_{ri}$ are provided as the patterns of the parallel flat-plates, and the bonding pad $G_{pi}$ and the bonding pad $G_{ri}$ are selectively contacted with the $n^+$-regions at the surface of the lower semiconductor substrate 11A, and the element-isolation insulating-films 19A are buried in the surface of the lower semiconductor substrate 11A in an inside area of the lower sealing-patterns 14A arranged on both sides in the cross-sectional view illustrated in FIG. 18. If the $n^+$-regions are a plurality of localized semiconductor regions selectively buried in the p-wells, the bonding pad $G_{pi}$ and the bonding pad $G_{ri}$ contact with the plurality of localized semiconductor regions, respectively and individually. Thus, in the concrete layout configuration of the integrated circuit, still other insulating films such as field insulating films shall be provided on the p-wells and the like, and through contact holes cut in the field insulating films, the bonding pads $G_{pi}$ and the bonding pads $G_{ri}$ may be selectively connected to the $n^+$-regions. In any case, the contact via-plugs illustrated in FIG. 16 become unnecessary.

Similarly to the structure illustrated in FIG. 17, the upper chip 10B encompasses the strip-shaped second sealing-land 14B orbiting along the periphery of the principal surface of the upper semiconductor substrate 11B on the upper insulating film 13B, and the outer sealing-wall $15_o$ and the inner sealing-wall $15_i$ which run parallel to each other, while being spaced apart from each other and adjacent to each other, along the periphery of the upper semiconductor substrate 11B, on the second sealing-land 14B. The upper-bumps $B_{upi}$ are aligned correspondingly to the array positions of the bonding pads $G_{upi}$ of the lower chip 41A. Thus, through windows (contact holes) cut in the lower insulating film 13A, the tips of the upper-bumps $B_{upi}$ are jointed to the surfaces of the bonding pads $G_{pi}$ by the solid-phase diffusion. Similarly, the upper-bumps $B_{uri}$ are aligned correspondingly to the array positions of the bonding pads $G_{ri}$ of the lower chip 41A. Thus, through windows (contact holes) cut in the lower insulating film 13A, the tips of the upper-bumps $B_{uri}$ are jointed to the surfaces of the bonding pads $G_{ri}$ by the solid-phase diffusion.

According to the stacked semiconductor device pertaining to the second variation of the fourth embodiment illustrated in FIG. 18, the bonding pad $G_{pi}$ and the bonding pad $G_{ri}$ are brought into selective contact with the semiconductor region of the $n^+$-regions buried in the surface of the lower semiconductor substrate 11A, and the element-isolation insulating-films 19A are buried in the surface of the lower semiconductor substrate 11A. Thus, although there may be concave and convex portions on the surface of the lower semiconductor substrate 11A, it is possible to achieve the electric contact between the lower integrated circuit merged in the lower chip 41A and the upper integrated circuit merged in the upper chip 10B, simultaneously when the hermetical sealing process is performed by the metallurgical connector between the lower sealing-pattern 14A and the upper sealing-pattern (14B, $15_o$ and $15_i$).

Other Embodiment

As described above, the first to fourth embodiments of the present invention have been described, but because Specifications and Drawings implement a mere part of the disclosure of the present invention, and it should not be understood that Specifications and Drawings are intended to limit the scope of the present invention. Various alternative embodiments, examples and operational techniques will become apparent to those skilled in the art from the above disclosure. In particular, according to the first and second embodiments, in light of the technology generations on and after 5G technology, the cases are exemplified which take into account the technical circumstances in which the miniaturized semiconductor integrated circuits are monolithically merged in both of the lower chip and the upper chip, wherein the design rules of the semiconductor integrated circuits are such that the pitch intervals between input electrodes and between output electrodes are desired to be ten micrometers or less. However, the present invention is not limited to the architectures exemplified in the first and second embodiments. Furthermore, although the case in which the miniaturized semiconductor integrated circuits are merged in the upper chip is exemplified in the third embodiment, the present invention is not limited to the exemplification in the third embodiment. As a matter of course, the subject matters of the technical idea of the present invention which can achieve the hermetical sealing by performing the solid-phase diffusion, constructing the metallurgical connector, can be applied to the stacked semiconductor devices belonging to the old technology generations employing looser design rules in which the pitch intervals between input electrodes and between output electrodes exceeds ten micrometers.

Moreover, in the first to fourth embodiments, the examples are explained for the case that a single upper chip is mounted on a single lower chip in one to one. However, the first to fourth embodiments are merely an exemplification. A structure is allowed in which, by making a size of the lower chip larger than a size of the upper chip, a plurality of upper chips are mounted on a single lower chip. For example, the lower chip may be provided as a parent substrate whose aperture is large, a plurality of upper chips shall be mounted on each of unit element areas divided along a matrix defined on a principal surface of the parent substrate, each of the unit element areas is defined as a chip mounting area, and a plurality of the lower sealing-pattern are assigned in each of the chip mounting areas, respectively. When the plurality of upper chips is mounted on the parent substrate, each of the lower sealing-patterns is arranged in "at least a partial area" of the lower chip, each of partial areas corresponds to the arrangement sites for the plurality of upper chips, respectively. Thus, the plurality of lower sealing-patterns arranged on the principal surface of the lower chip become a plurality of patterns, which are assigned respectively to the counterpart site in the array topology of the plurality of upper chips. That is, the lower sealing-pattern does not orbit along the periphery of the lower chip, but each of the corresponding lower sealing-patterns individually orbits around the plurality of chip mounting areas, each of which is defined by "the at least a partial area". Then, the hermetical sealings may be achieved by the solid-phase diffusions, through bonding process of the upper sealing-patterns of each of the plurality of upper chips to the counterpart lower sealing-patterns, which are assigned in the shape of the array to the plurality of chip mounting areas, respectively. And, the independent metallurgical connectors can be constructed in each of the plurality of chip mounting areas, respectively. Therefore, individual hermetical sealed spaces can be established on each of the plurality of chip mounting areas, respectively.

In addition, although the parallel configurations such that the couple of wall-shaped patterns running in parallel on the upper chip as the upper sealing-patterns are explained in the first and second embodiments, the parallel configurations are merely exemplifications. Moreover, in the second embodiment, although the parallel configuration is explained which includes the couple of wall-shaped patterns running parallel to each other as the lower sealing-pattern on the lower chip, the parallel configuration on the lower chip is merely an exemplification. The number of the wall-shaped patterns running in parallel along the periphery of the chips may be a single, and furthermore, it is allowed to adopt configurations that include triple or more wall-shaped patterns running parallel to each other for improving reliability. In order to establish a pattern, reducing the number of the wall-shaped patterns to single, procedures such that a U-groove having vertical sidewalls is built by a pattern of photo-resist film, and oblique evaporation technique or oblique sputtering technique shall be performed so that metallic film is deposited on only one of the vertical sidewalls of the U-groove, and after that, the photo-resist pattern shall be removed, can be employed. For example, according to the fabrication method of the planar pattern of the outer sealing-wall $15_o$ and the inner sealing-wall $15_i$ illustrated in FIG. 3 and others, because the outer sealing-wall $15_o$ and the inner sealing-wall $15_i$ are extending both in X-direction and Y-direction, respectively, surrounding the periphery so as to implement the rectangle, the oblique evaporations shall be performed in each of a direction orthogonal to the X-direction and a direction orthogonal to the Y-direction.

In order to construct the pattern of triple walls, it will be prepared a pattern of photo-resist films, which encompasses a U-groove having vertical sidewalls and a pedestal pattern having a protrusion of the same width as the U-groove along one of the walls of the U-groove. And, the metallic films are deposited on each of the triple vertical sidewalls, by the oblique evaporation techniques or oblique sputtering techniques, which are performed from double directions, and after that, the pattern of the photo-resist film shall be removed. Because the pattern of the triple walls is supposed to have outer sealing-walls and an inner sealing-wall, which extend in the X-direction and the Y-direction so as to surround the periphery of the chip, the oblique evaporation techniques or oblique sputtering techniques are actually performed twice along each of the two directions, and therefore, a total of quadruple oblique evaporation processes or quadruple oblique spattering processes shall be performed. In order to construct the pattern of quadruple walls, double U-grooves shall be delineated in parallel, each of the U-grooves has the double vertical sidewalls, by the photo-resist film. And thereafter, the metallic films are deposited on the quadruple vertical sidewalls in the double U-grooves, through the oblique evaporation techniques or oblique sputtering techniques performed along both directions. And finally, the photo-resist pattern shall be removed.

Moreover, in the first and fourth embodiments, although the flat strip-shaped lower sealing-patterns have been explained, the lower sealing-patterns go around the periphery of the lower insulating film at the surface level of the lower insulating film, on the lower insulating film of the lower chip, the horizontal levels of the lower sealing-patterns are merely exemplifications. Moreover, in the third embodiment, although the flat strip-shaped lower sealing-pattern has been explained, the lower sealing-pattern goes around the periphery of the lower chip at the surface level of the lower chip, on the lower chip, the horizontal level is merely an exemplification. The horizontal levels of the lower sealing-pattern can be disposed at the bottom of a concave portion that is located at the level lower than the surface level of the lower insulating film. Or alternatively, the horizontal levels of the lower sealing-pattern can be disposed at the bottom of the concave portion that is located at the level lower than the surface level of the lower chip. Under a condition that the lower sealing-pattern is arranged at the level lower than the surface level of the lower insulating film, a U-groove or a V-groove is carved in the surface of the lower insulating film, and the lower sealing-pattern is deposited on the bottom of the U-groove or the slant sidewalls of the V-groove. Therefore, the lower sealing-pattern can be built not only by the shape of band on the bottom of the U-groove but also by the vertical sidewalls of the U-groove. If the lower sealing-pattern is built by the sidewalls of the U-groove or V-groove, and the orbiting configuration is established, the lower sealing-pattern is not flat, and the lower sealing-pattern is implemented by two or more planes. In the configurations of the first and fourth embodiments, in a case that the U-groove or V-groove is carved in the surface of the lower insulating film, the U-groove or V-groove can be made deeper so as to penetrate the lower insulating film, and accordingly, the U-groove or V-groove can be carved further in the lower semiconductor substrate.

Moreover, there is other embodiment of the present invention, as variations of the first and fourth embodiments, in which the U-groove or V-groove is carved in the surface of the lower insulating film so that the first sealing-land is disposed at the level lower than the surface level of the lower insulating film. In the other embodiment, the first sealing-land is provided on the bottom of the U-groove or the slant sidewalls of the V-groove, and with the first sealing-land as base pattern, two wall-shaped patterns running parallel to each other will be built on the first sealing-land, and the lower sealing-pattern is accordingly established. Similarly, in the configuration of the third embodiment, under a condition that the lower sealing-pattern is provided in the concave portion lower than the surface level of the lower chip, it is possible to carve the U-groove or V-groove in the surface of the lower chip, and therefore, it is possible to implement the lower sealing-pattern on the bottom of the U-groove or the sidewalls of the V-groove. In the architecture serving as the variation of the third embodiment, under a condition that the lower sealing-pattern is provided on the sidewalls of the U-groove or V-groove, the lower sealing-pattern is not flat.

As described above, the technical ideas described in the first to fourth embodiments are merely examples, and can be applied to any modified stacked semiconductor device in which any part of the configurations described in one of the first to fourth embodiments is arbitrarily applied, with any mutual combination if required. Therefore, it is a matter of course that the present invention includes various modified examples of the first to fourth embodiments, which are not described in the stacked semiconductor device according to the first to fourth embodiments. Therefore, the technical scope of the present invention is determined only by the "technical features specifying the invention" construed from the scope of claims, if the determined technical feature that can be interpreted from the claims is appropriate from the above description.

REFERENCE SIGNS LIST 10A, 20A, 21A, 40A, 41A, 42A . . . a lower chip; 10B, 20B . . . an upper chip; 11A . . . a lower semiconductor substrate; 11B . . . an upper semiconductor substrate; 13A, 23A . . . a lower insulating film; 13B, 23B . . . an upper insulating film; 14A . . . a lower sealing-pattern (first sealing-land): 14B . . . a second sealing-land; $15_i$, $16_i$, $17_i$, $32_i$, $33_i$, $34_i$ . . . an inner sealing-wall; $15_o$, $16_o$, $17_o$, $32_o$, $33_o$, $34_o$ . . . an outer sealing-wall; 19A . . . an element-isolation insulating-film.

The invention claimed is:

1. A stacked semiconductor device comprising:
    an upper semiconductor substrate in which an upper integrated circuit is merged;
    an upper insulating film laminated on a principal surface of the upper semiconductor substrate;
    an upper sealing-pattern implementing a closed-loop planar pattern orbiting along a periphery of the upper insulating film;
    a lower chip defining a chip mounting area in at least a part of a principal surface, the principal surface of the lower chip is facing to the upper insulating film; and
    a lower sealing-pattern disposed on the principal surface of the lower chip, delineating a pattern mating to a topology of the upper sealing-pattern, orbiting around the chip mounting area, configured to implement a metallurgical connector, by solid-phase diffusion bonding of the upper sealing-pattern to the lower sealing-pattern,
    wherein a hermetical sealed space is established in an inside of the chip mounting area, the upper insulating film and the metallurgical connector, and the upper sealing-pattern includes wall-shaped patterns running parallel to each other.

2. The stacked semiconductor device of claim 1, wherein the lower sealing-pattern includes wall-shaped patterns running parallel to each other.

3. The stacked semiconductor device of claim 2, wherein planar patterns of the lower and upper sealing-patterns delineate meander-lines, the meander-lines of the lower and upper sealing-patterns differ from each other in spatial phase configured to intersect each other at a plurality of locations.

4. The stacked semiconductor device of claim 1, wherein the lower sealing-pattern or the upper sealing-pattern is made of gold or alloy including gold.

* * * * *